United States Patent
Yanagisawa

(10) Patent No.: US 6,509,630 B1
(45) Date of Patent: Jan. 21, 2003

(54) FLEXIBLE INTERCONNECTING SUBSTRATE, FILM, CARRIER, TAPE-SHAPED SEMICONDUCTOR DEVICE, SEMICONDUCTOR DEVICE AND METHOD OF MANUFACTURING THE SAME, CIRCUIT BOARD, AND ELECTRONIC EQUIPMENT

(75) Inventor: Masahiko Yanagisawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/674,915

(22) PCT Filed: Mar. 8, 2000

(86) PCT No.: PCT/JP00/01389

§ 371 (c)(1),
(2), (4) Date: Nov. 8, 2000

(87) PCT Pub. No.: WO00/54324

PCT Pub. Date: Sep. 14, 2000

(30) Foreign Application Priority Data

Mar. 11, 1999 (JP) ............................................. 11-065227

(51) Int. Cl.[7] ............................................. H01L 23/495
(52) U.S. Cl. ....................... 257/668; 257/701; 257/671; 257/723; 257/673; 257/675; 257/680; 438/112; 438/110; 438/121; 438/122; 438/113; 438/464
(58) Field of Search ................................. 257/668, 701, 257/671, 723, 673, 679, 680; 438/112, 110, 121, 122, 113, 464

(56) References Cited

U.S. PATENT DOCUMENTS 4,977,441 A * 12/1990 Ohtani et al. ................. 357/70
6,057,174 A * 5/2000 Hashimoto ................... 438/110

FOREIGN PATENT DOCUMENTS

| JP | 54-143161 | 10/1979 |
| JP | 4-80048 | 7/1992 |
| JP | 5-121486 | 5/1993 |
| WO | WO-0-054324 | 9/2000 |

OTHER PUBLICATIONS

U.S. patent application Ser. No. 09/674,924, Yanagisawa, filed Nov. 2000.
U.S. patent application Ser. No. 09/492,383, Yanagisawa, filed Jan. 2000.

* cited by examiner

Primary Examiner—David L. Talbott
Assistant Examiner—Luan Thai
(74) Attorney, Agent, or Firm—Oliff & Berridge, PLC.

(57) ABSTRACT

The flexible interconnecting substrate (1) has a tape-shaped base substrate (10), a plurality of interconnecting patterns (20) formed on a base substrate (10), and a plurality of reinforcing sections (40) formed on the base substrate 10. The plurality of reinforcing sections (40) is formed along the longitudinal direction of the base substrate (10), and at least part of each of the interconnecting patterns (20) is formed at a position away from each of the reinforcing sections (40) in the widthwise direction of the base substrate (10).

43 Claims, 17 Drawing Sheets

FLEXIBLE INTERCONNECTING SUBSTRATE, FILM, CARRIER, TAPE-SHAPED SEMICONDUCTOR DEVICE, SEMICONDUCTOR DEVICE AND METHOD OF MANUFACTURING THE SAME, CIRCUIT BOARD, AND ELECTRONIC EQUIPMENT

TECHNICAL FIELD

The present invention relates to a flexible interconnecting substrate, a film carrier, a tape-shaped semiconductor device, a semiconductor device and a method of manufacturing the same, a circuit board, and electronic equipment.

BACKGROUND ART

A tape automated bonding (TAB) method is known in the art for mounting semiconductor chips onto a flexible interconnecting substrate. Leads are formed on the flexible interconnecting substrate, and the leads, semiconductor chips, and pads are connected.

In the TAB method, the flexible interconnecting substrate is bent and subjected to a reel-to-reel process. However, a lead may be bent when the flexible interconnecting substrate is wound onto the reel.

DISCLOSURE OF THE INVENTION

The present invention has been achieved to solve the above problem and has as an objective of providing a flexible interconnecting substrate which can prevent bending of a lead, a film carrier, a tape-shaped semiconductor device, a semiconductor device, a method of manufacturing the semiconductor device, a circuit board, and electronic equipment.

(1) A flexible interconnecting substrate according to the present invention comprises:
  a tape-shaped base substrate;
  interconnecting patterns formed on the base substrate; and
  reinforcing sections formed on the base substrate,
    wherein each of the reinforcing sections is formed along the longitudinal direction of the base substrate, and
    wherein at least part of each of the interconnecting patterns is formed in a position away from each of the reinforcing sections in the widthwise direction of the base substrate.

Because part of the base substrate in which the reinforcing section is formed is less liable to bend than the part without the reinforcing sections, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend when the tape-shaped base substrate is wound up.

(2) In this flexible interconnecting substrate,
  holes may be formed in the base substrate, and
  at least part of each of the reinforcing sections may be formed in a position away from each of the holes in the widthwise direction of the base substrate.

According to this structure, a decrease in the strength at a portion closed to the hole in the base substrate is prevented by the reinforcing section.

(3) In this flexible interconnecting substrate,
  the holes may be formed in the base substrate with predetermined interval in the longitudinal direction.

(4) In this flexible interconnecting substrate,
  part of each of the interconnecting patterns may be placed in the holes.

Although the part of the interconnecting pattern projecting in the hole is not supported by the base substrate, bending is suppressed because the strength of the base substrate itself is maintained by the reinforcing section.

(5) In this flexible interconnecting substrate,
  the reinforcing sections may be formed along an edge portion in the widthwise direction of the base substrate, and
  the interconnecting patterns may be formed in a center in the widthwise direction of the base substrate.

(6) In this flexible interconnecting substrate,
  the reinforcing sections may be formed from the same material as the interconnecting patterns.

(7) In this flexible interconnecting substrate,
  the base substrate may include regions to be punched out, and
  the interconnecting patterns may be formed in the regions to be punched out.

(8) In this flexible interconnecting substrate,
  each of the reinforcing sections may be formed along the entire length of each of the regions to be punched out in the longitudinal direction of the base substrate.

According to this constitution in which the region to be punched out is positively reinforced, bending (deformation) of the entire area to be punched out is prevented, even if the base substrate is bent.

(9) In this flexible interconnecting substrate,
  the reinforcing sections may be formed outside the region to be punched out.

According to this structure, the reinforcing section can be removed when the base substrate is punched out.

(10) A flexible interconnecting substrate according to the present invention comprises:
  a tape-shaped base substrate in which holes are formed;
  interconnecting patterns formed on the base substrate; and
  reinforcing sections formed on the base substrate and formed along the longitudinal direction of the base substrate at a position away from the holes in the widthwise direction of the base substrate,
    wherein each of the reinforcing sections comprises a first portion formed in the both ends of each of the holes and a second portion formed beyond the both ends of each of the holes, the first portion having a higher strength than the second portion, and
    wherein at least part of each of the interconnecting patterns is formed in a position away from the reinforcing sections in the widthwise direction of the base substrate.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting patterns can be prevented, because the part in which at least part of the interconnecting pattern is formed is difficult to bend when the tape-shaped base substrate is wound up.

In particular, because the first portion of the reinforcing section formed in the both ends of the hole has a higher strength than the second portion which is the part other than the first portion, a decrease in the strength of the base substrate due to formation of the holes can be prevented.

(11) In this flexible interconnecting substrate,
the reinforcing sections may be formed from the same material as the interconnecting patterns and the first portion has a width greater than the second portion.

(12) A flexible interconnecting substrate according to the present invention comprises:
a tape-shaped base substrate in which holes are formed;
interconnecting patterns formed on the base substrate and extending across the holes; and
reinforcing sections formed on the base substrate,
wherein each of the reinforcing sections is formed along the longitudinal direction of the base substrate, at a position away from each of the holes in the widthwise direction of the base substrate, and each of the reinforcing members has a length of at least the entire length of each of the holes in the longitudinal direction of the base substrate.

Because part of the base substrate in which the reinforcing section is formed is less liable to bend than the part without the reinforcing section, bending stress is concentrated in the part without the reinforcing section. Deformation of the interconnecting pattern in the part in which the interconnecting pattern extends across the hole can be avoided when the tape-shaped base substrate is wound up, because this part is difficult to bend due to reinforcement by the reinforcing section.

(13) In this flexible interconnecting substrate,
a plating lead may be formed on the base substrate.

(14) In this flexible interconnecting substrate,
the plating lead may be formed separately from the reinforcing sections.

(15) In this flexible interconnecting substrate,
the plating lead may comprise a wide part and a narrow part, and the wide part may be used as the reinforcing section.

(16) A film carrier according to the present invention comprises:
a base substrate;
an interconnecting pattern formed on the base substrate; and
a reinforcing section formed on the base substrate,
wherein the reinforcing section is formed along the longitudinal direction of the base substrate, and
wherein at least part of the interconnecting pattern is formed in a position away from the reinforcing section in the widthwise direction of the base substrate.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend due to reinforcement by the reinforcing section.

(17) A tape-shaped semiconductor device of the present invention comprises:
the above-described flexible interconnecting substrate; and
semiconductor chips connected electrically to the interconnecting patterns of the flexible interconnecting substrate.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend when the tape-shaped base substrate is wound up.

(18) A semiconductor device according to the present invention comprises:
a base substrate;
an interconnecting pattern formed on the base substrate;
a reinforcing section formed on the base substrate; and
a semiconductor chip connected electrically to the interconnecting pattern,
wherein the reinforcing section is formed along the longitudinal direction of the base substrate, and
wherein at least part of the interconnecting pattern is formed in a position away from the reinforcing section in the widthwise direction of the base substrate.

Because part of the base substrate in which the reinforcing section is formed is less liable to bend than the part without the reinforcing section, bending stress is concentrated in the part without the reinforcing section. Deformation of the interconnecting pattern can be avoided, because the part in which at least part of the interconnecting pattern is formed away from the reinforcing section in the widthwise direction of the base substrate is difficult to bend.

(19) A semiconductor device of the present invention has a shape obtained by punching-out the base substrate of the above-described tape-shaped semiconductor device, along an outline that surrounds one of the semiconductor chips.

Such a semiconductor device is not limited to one obtained by punching out the base substrate of the above described tape-shaped semiconductor device. Any semiconductor device having a similar shape and configuration to one that obtained by punching out.

(20) A circuit board according to the present invention is electrically connected to the above-described semiconductor device.

(21) Electronic equipment of the present invention comprises the above-described semiconductor device.

(22) A method of manufacturing a semiconductor device according to the present invention comprises the steps of:
winding the above-described flexible interconnecting substrate onto a reel in preparation, and then
pulling the flexible interconnecting substrate out from the reel.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend when the tape-shaped base substrate is wound up.

(23) A method of manufacturing a semiconductor device of the present invention comprises the steps of:
winding a tape-shaped semiconductor device which includes the above-described flexible interconnecting substrate and semiconductor chips connected electrically to the interconnecting patterns of the flexible interconnecting substrate, onto a real in preparation; and then pulling the tape-shaped semiconductor device out from the reel.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend when the tape-shaped base substrate is wound up.

(24) A method of manufacturing a semiconductor device of the present invention comprises the steps of:

winding a tape-shaped semiconductor device which includes the above-described flexible interconnecting substrate and semiconductor chips connected electrically to the interconnecting patterns of the flexible interconnecting substrate, onto a real in preparation;

pulling the tape-shaped semiconductor device out from the reel; and then punching out the flexible interconnecting substrate in the region to be punched out.

Because part of the base substrate in which the reinforcing section is formed is less liable to bend than the part without the reinforcing section, bending stress is concentrated in the part without the reinforcing section. At least part of the interconnecting pattern is formed at a position away from the reinforcing section in the widthwise direction of the base substrate. Deformation of the interconnecting pattern can be avoided, because the part in which at least part of the interconnecting pattern is formed is difficult to bend when the tape-shaped base substrate is wound up.

BEST MODE FOR CARRYING OUT THE INVENTION

Preferred embodiments to which the present invention is applied will be described below with reference to the accompanying figures. The present invention, however, is not limited to these embodiments.

Flexible Interconnecting Substrate

Figure 1:
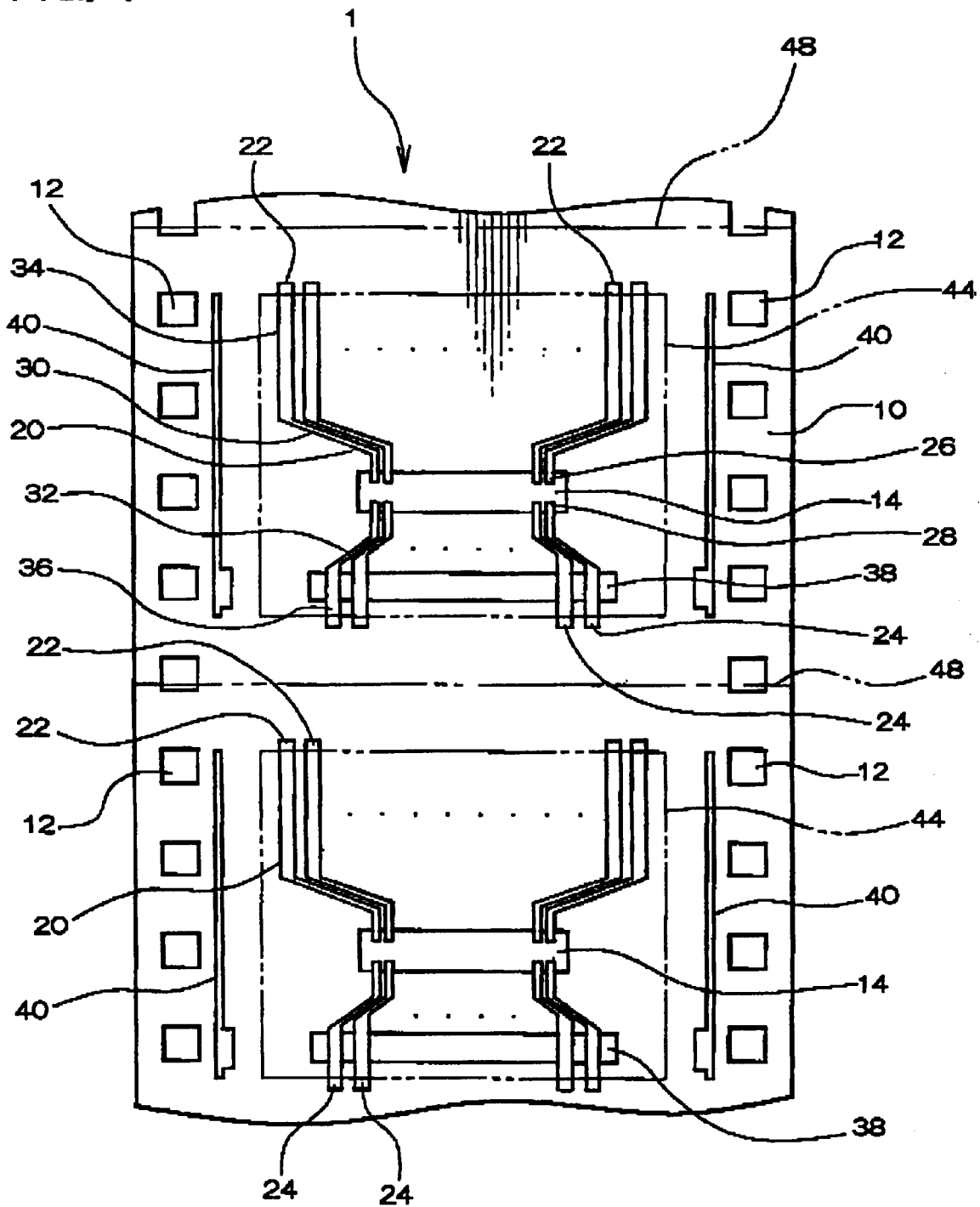
FIG. 1 shows a flexible interconnecting substrate in accordance with an embodiment to which the present invention is applied.

A flexible interconnecting substrate in accordance with an embodiment of the present invention is shown in FIG. 1. The flexible interconnecting substrate 1 comprises a base substrate 10 and a plurality of interconnecting patterns 20. The flexible interconnecting substrate 1 may be handled by being wound onto a reel 46 shown in FIG. 2A. If the TAB technique is applied, the flexible interconnecting substrate 1 is a substrate for TAB (a film carrier tape), but it is not limited thereto and thus could equally well be a substrate for chip-on-film (COF) packaging or a substrate for chip-on-board (COB) packaging.

The base substrate 10 is a base material of an elongate form (tape-shaped) that acts as a support member for the interconnecting patterns 20. The base substrate 10 has flexibility. The base substrate 10 is frequently formed of a polyimide resin, but other known materials may be used therefor. If a plurality of sprocket wheel holes 12 are formed along both edge portions of the base substrate 10 in the longitudinal direction, the flexible interconnecting substrate 1 may be sent out by causing these holes 12 to engage with fingers (sprockets) which are not shown in the drawing.

If the TAB technique is used, one device hole 14 (or a plurality thereof overall) is formed in each interconnecting pattern 20 on the base substrate 10. A semiconductor chip 60 (see FIG. 4) and its electric connection parts (e.g. inner leads 26, 28) can be bonded through the device hole 14. There are no specific limitations to the shape of the device hole 14. In addition, the device hole 14 may be of a size to house either the entire semiconductor chip 60 or part thereof.

A plurality of interconnecting patterns 20 is formed on the base substrate 10. In the flexible interconnecting substrate 1 that has a three-layer substrate, the interconnecting patterns 20 are connected to the base substrate 10 by an adhesive (not shown in the drawings). In the flexible interconnecting substrate that has a two-layer substrate, the interconnecting patterns 20 are formed on the base substrate 10 with no adhesive therebetween.

The interconnecting patterns 20 may be formed aligned in the longitudinal direction of the tape-shaped base substrate 10, in the widthwise direction thereof, or in a matrix form (aligned in both the longitudinal direction and the widthwise direction). The interconnecting patterns 20 often have the same shape, but they may also be of different shapes. For example, an interconnecting pattern group that is configured of an array of n interconnecting patterns 20 of n different shapes may be formed repeatedly.

The interconnecting pattern 20 may be formed by laminating two or more layers of copper (Cu), chromium (Cr), titanium (Ti), nickel (Ni), or titanium tungsten (Ti-W), or may be formed from one layer of either one of these materials. The interconnecting pattern 20 is preferably plated with a solder, tin, gold, or nickel. Metal plating which forms an eutectic is preferable because of the ease of formation of the metal junction. For electroplating, a plurality of interconnecting patterns 20 may be electrically connected by a plating lead (not shown in the drawing).

Each of the interconnecting patterns 20 has a plurality of interconnects 22 and 24. More specifically, a plurality of interconnects 22 is formed in the longitudinal direction of the base substrate 10 on one side of the device hole 14 (the upper side in FIG. 1) and a plurality of interconnects 24 is formed on the other side thereof (the lower side in FIG. 1).

The interconnects 22 and 24 include inner leads 26, 28 formed on one end, oblique portions 30, 32 extending in the direction which expands the spaces thereof, and other ends 34, 36.

The inner leads 26, 28 project into the device hole 14. The plurality of inner leads 26 and plurality of inner leads 28 may be arranged in parallel and extend in the longitudinal direction of the base substrate 10. The inner leads 26 and 28 are electric connection parts for the semiconductor chip 60.

Oblique portions 30 and 32 are formed obliquely in the direction to expand the space between the inner leads 26 and 28. The oblique portions 30 and 32 may be either straight or curved.

The end portions 34 and 36 are formed as extensions for the oblique portions 30 and 32 on the other side of the inner leads 26 and 28. The plurality of end portions 34 and plurality of end portions 36 may be arranged in parallel and extend in the longitudinal direction of the base substrate 10. The end portions 34 and 36 may be formed to have a larger width in either the width or pitch than the inner leads 26 and 28. The end portions 34 and 36 are electrically connected to other electrical parts. In the example shown in FIG. 1, the end portion 36 of the interconnect 24 are formed across the outer lead hole 38. The part of the end portion 36 which is present within the outer lead hole 38 constitutes an outer lead.

A plurality of reinforcing sections 40 is formed on the base substrate 10. The reinforcing sections 40 increase the bending resistant strength of the base substrate 10 and suppress bending of the interconnecting pattern 20. The plurality of reinforcing sections 40 is arranged with spaces in the longitudinal direction of the base substrate 10. It is possible to form the reinforcing sections 40 on ends (along both edge portions) of the base substrate 10, so that the interconnecting pattern 20 is formed in the widthwise direction around the center of the base substrate 10, as shown in FIG. 1. In this instance, each reinforcing section 40 extends in the longitudinal direction of the base substrate 10. At least part of the interconnecting patterns 20 is formed at a position separated from any one of the reinforcing sections 40 in the widthwise direction of the base substrate 10. The reinforcing sections 40 may be formed along the entire length of a punching region 44 in the base substrate 10 in the longitudinal direction.

Part of the reinforcing section 40 may be formed at a position away from holes (e.g. device holes 14 or outer lead holes 38) formed in the base substrate 10 in the widthwise direction of the base substrate 10. This ensures that part of the base substrate 10 which is easily bent due to formation of the holes is reinforced by reinforcing sections 40. In addition, part of the reinforcing section 40 may be formed in a large size (large width) at positions away from holes (in FIG. 1, the outer lead holes 38) in the widthwise direction of the base substrate 10. Specifically, the reinforcing sections 40 comprise a first portion having a length of the entire length of the holes (for example, outer lead holes 38) in the longitudinal direction of the base substrate and a second portion formed in the positions beyond the entire length of the holes in the longitudinal direction of the base substrate, and the first portion may have a width greater than the second portion. In this manner, the first portion may be provided with a higher strength than the second portion. In the embodiment shown in FIG. 1, bending of the part of the interconnecting patterns 20 located inside the outer lead holes 38 can be suppressed due to the first portion having a greater width.

Any material can be used as the reinforcing sections 40 inasmuch as such a material can increase the bending resistant strength of the base substrate 10. A material harder (having a greater rigidity) than the material of the base substrate 10 can be used for forming the reinforcing sections 40. For example, the same material as used for the interconnecting patterns 20 can be used for forming the reinforcing sections 40. In this case, the reinforcing sections 40 can be formed simultaneously with the interconnecting patterns 20 in the fabrication process. Alternatively, the reinforcing sections 40 may be formed from films (which may be of the same material as the base substrate 10). In addition, the same material as used for a protective film 42 (see FIG. 4) covering the interconnecting patterns 20, a solder resist, for example, may also be used for forming the reinforcing sections 40. In this instance, the reinforcing sections 40 may be formed simultaneously when the protective film 42 is formed the interconnecting patterns 20 preferably from a material, such as heat resistant material, which does not interfere with the packaging process of semiconductor chips (for example, inner lead bonding). Specifically, it is preferable that the reinforcing sections 40 be formed from a heat resistant material which is not subjected to plastic deformation at a curing temperature of a mold resin (about 120° C. to 150° C.).

Any part of the reinforcing sections 40, that is, the part formed from the same material as the interconnecting patterns 20, the part formed from the same material as the protective film 42, or the part made from a film, may consist of two or more layers. The reinforcing sections 40 may be formed simultaneously with the interconnecting patterns 20, protective film 42, or films in the fabrication process also in this instance.

Figure 5:
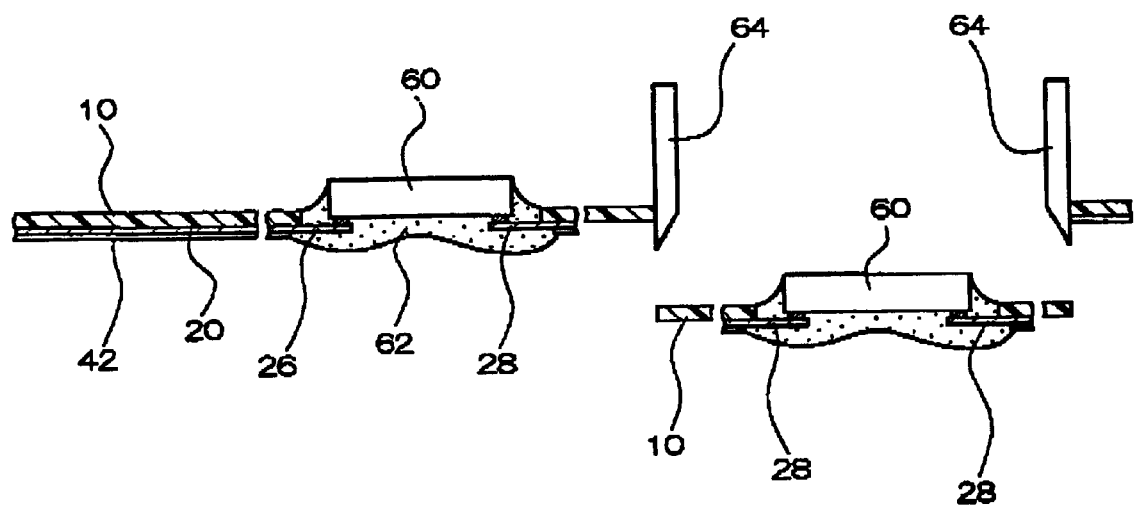
FIG. 5 shows a method of fabricating the semiconductor device in accordance with an embodiment to which the present invention is applied.

A protective film 42 may be provided on the interconnecting patterns 20 (see FIG. 5). The protective film 42 protects the interconnecting patterns 20 from oxidation or the like. The protective film 42 may be formed from a resin such as a solder resist, for example. The protective film 42 is provided to cover the interconnecting patterns 20 except for the portions in electrical contact with other components such as a semiconductor chip (such as the inner leads 26 and 28, external terminals, and outer leads).

Each interconnecting pattern 20 is for the manufacture of one semiconductor device and the flexible interconnecting substrate 1 is for the manufacture of a plurality of semiconductor devices. The base substrate 10 is provided with a plurality of punching regions 44. A semiconductor device is manufactured by punching out a punching region 44 from the base substrate 10. Each interconnecting pattern 20 is formed in each punching region 44. The interconnecting patterns 20 may be formed extending outside the punching region 44. In other words, part of the interconnecting patterns 20 may be located outside the punching region 44.

The above-described reinforcing sections 40 may be formed along the entire length of the punching region 44 in the base substrate 10 in the longitudinal direction. This reinforces part of the semiconductor device which is to be punched-out and becomes a complete semiconductor device among the base substrate 10.

Figure 2A:
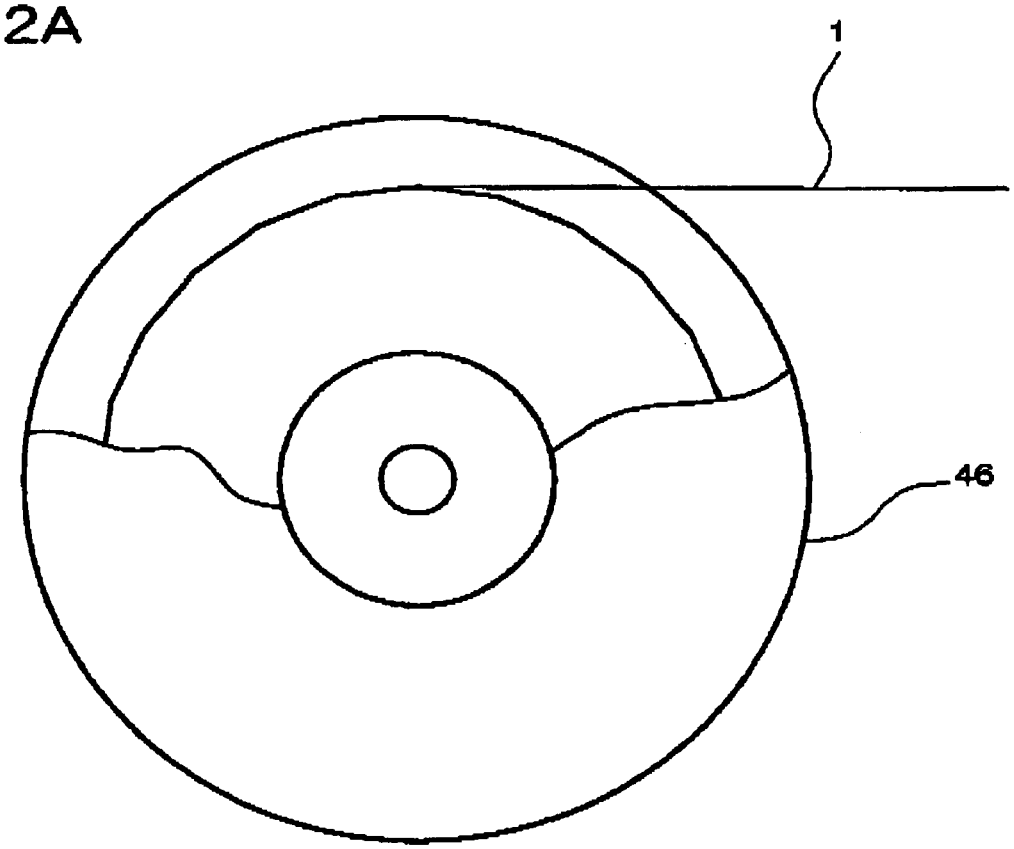
FIGS. 2A and 2B show use conditions of a flexible interconnecting substrate in accordance with an embodiment to which the present invention is applied.
Figure 2B:
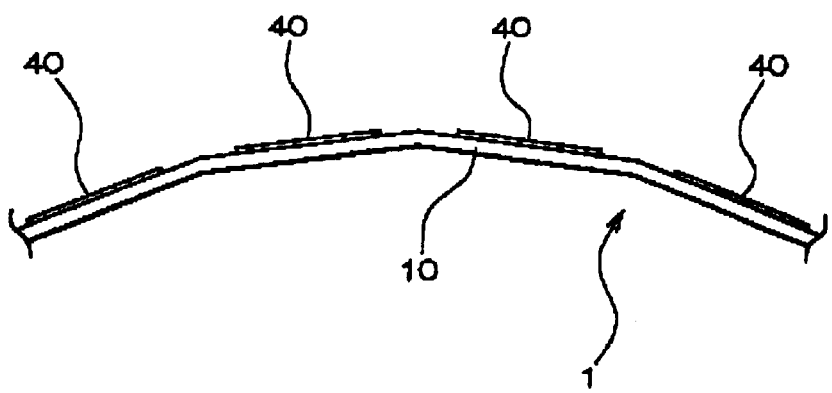

FIG. 2A shows the use conditions of the flexible interconnecting substrate in accordance with this embodiment, and FIG. 2B is a side view of part of the flexible interconnecting substrate. As shown in FIG. 2A, the flexible interconnecting substrate 1 is wound onto a reel 46. In this instance, the axis in the longitudinal direction of the base substrate 10 is bent. However, in this embodiment, a plurality of reinforcing sections 40 is formed on the base substrate 10. Accordingly, a large bending stress is applied to portions in which no reinforcing section 40 is formed. A significant curvature is evident in the portions without any reinforcing section, but this is small in the portions with a reinforcing section, as shown in FIG. 2B. Because the interconnecting patterns 20 are formed in the portions where the curve is small as shown in FIG. 1, bending of the interconnecting patterns 20 is suppressed.

A reel-to-reel fabrication process may be performed by drawing out the flexible interconnecting substrate 1 from the reel 46 in this manner.

Film Carrier

In a film carrier in accordance with the embodiment to which the present invention is applied, the flexible interconnecting substrate of FIG. 1 has a configuration cut along the lines in the widthwise direction (broken lines connected by two dots in FIG. 1). The film carrier is, for example, a piece of film cut from the above-mentioned flexible interconnecting substrate 1. There is no specific limitations to the position where the flexible interconnecting substrate 1 is cut. In the example shown in FIG. 1, both sides of one interconnecting pattern 20 act as cutting positions, but both sides of a plurality of interconnecting patterns 20 could equally well be used as cutting positions.

Manufacturing Method of Tape-shaped Semiconductor Device

Figure 3:
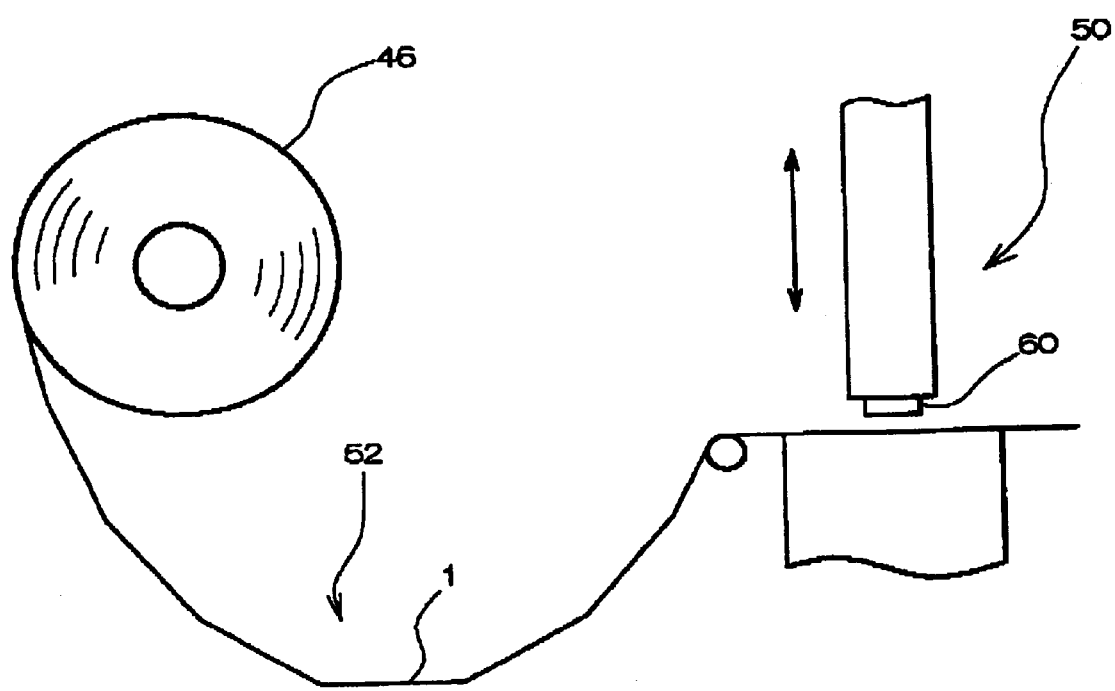
FIG. 3 is a drawing illustrating a method of fabricating the tape-shaped semiconductor device in accordance with an embodiment to which the present invention is applied.

FIG. 3 is a drawing illustrating a method for fabricating the tape-shaped semiconductor device in accordance with an embodiment to which the present invention is applied.

As shown in FIG. 3, a flexible interconnecting substrate 1 which is wound onto a reel 46 is played out from the reel 46 to a bonding unit 50 in which semiconductor chips are mounted on the flexible interconnecting substrate 1. A buffer region (slack) is provided between the reel 46 and the bonding unit 50 to ensure that semiconductor chips are mounted on the flexible interconnecting substrate 1, even if the amount of the flexible interconnecting substrate 1 played out from the reel 46 is not synchronized with the tact time of the bonding unit 50.

Because the flexible interconnecting substrate 1 is suspended in the buffer region 52 by its own weight, the lowest portion is bent by this weight. A bending stress is thus applied to the flexible interconnecting substrate 1. However, because the flexible interconnecting substrate 1 of this embodiment is provided with the reinforcing sections 40, the bending stress is concentrated in the portion between two reinforcing sections 40. Therefore the case where the bending stress is applied to electric connection parts (for example, inner leads 26, 28) is avoided and occurrence of cracks and breakage is prevented.

Tape-shaped Semiconductor Device

Figure 4:
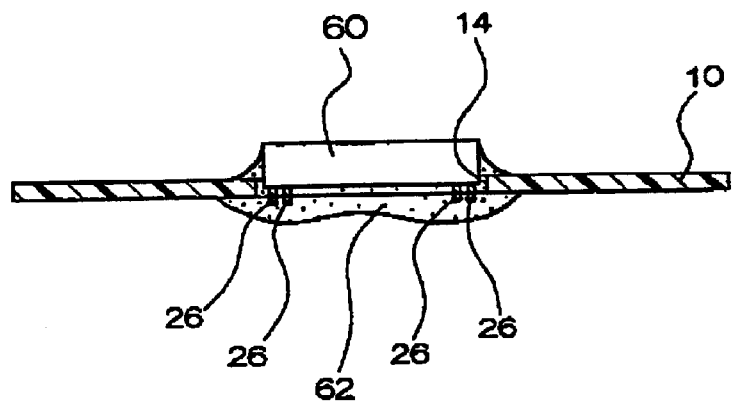
FIG. 4 shows a tape-shaped semiconductor device in accordance with an embodiment to which the present invention is applied.

FIG. 4 shows a tape-shaped semiconductor device in cross-section along the line extending in the longitudinal direction of the base substrate 10 in accordance with an embodiment to which the present invention is applied.

This tape-shaped semiconductor device has the above described flexible interconnecting substrate 1, and a plurality of semiconductor chips 60 connected electrically to the interconnecting patterns 20 thereof.

The planar shape of each semiconductor chip 60 is generally quadrangular, specifically, the shape may either rectangular or square. A plurality of electrodes is formed on one surface of each semiconductor chip 60. The electrodes are aligned along at least one side (two or four sides in many cases) of the surface of the semiconductor chip. If the outer shape of each semiconductor chip 60 is rectangular, the electrodes may be arrayed in the longitudinal direction of the semiconductor chip, as in the case of ICs for a liquid crystal drive, for example, or they may be arrayed in the shorter direction thereof. In some cases, the electrodes may be arrayed at an end portion of the surface of each semiconductor chip 60, or they may be arrayed in the center thereof. The electrodes are often configured as pads that are formed thinly and flat from a material such as aluminum, with bumps formed on the top thereof. If bumps are not formed, the pads alone become electrodes. A passivation film (not shown in the figure) is formed over the semiconductor chip 60, except for at least part of the electrodes. The passivation film can be formed of a material such as $SiO_2$, SiN, or polyimide resin, for example.

The electrodes of the semiconductor chips 60 may be bonded to the inner leads 26 and 28 of the interconnecting patterns 20 through the device hole 14, by applying the TAB technique.

Alternatively, when a flexible interconnecting substrate with no device hole 14 is used, face-down bonding of the semiconductor chips 60 way be employed. In such a case, the flexible interconnecting substrate could be a substrate wherein the active surface of the semiconductor chip 60 (the surface on which electrodes are formed) and the base substrate are on opposite sides, in other words, chip-on-film (COF) mounting.

Alternatively, the semiconductor chip 60 can be bonded by face-up bonding using a wire bonding technique or the like. In such a case, the active surface of the semiconductor chip 60 (the surface on which electrodes are formed) is orientated in the same direction as the mounting surface of the base substrate of the flexible interconnecting substrate, for example, the electrodes of the semiconductor chip 60 can be connected to the interconnecting pattern 20 by interconnects (fine interconnects) of gold wire or the like to give a face-up-mounted substrate.

The tape-shaped semiconductor device may have a seal portion 62. The sealing material 62 seals at least the electrically connecting portions (e.g. inner leads 26, 28) between the electrodes for the semiconductor chip 60 and the interconnecting pattern 20. In many cases, the seal portion 62 is formed from a resin.

The seal portion 62 preferably overlaps the end parts of the protective film 42 in the boundaries of the part covered by the protective film 42 in the interconnecting patterns 20 and the part not covered by such a protective film (see FIG. 5). This makes it possible to prevent exposure of the interconnecting patterns 20. The resin forming the sealing part 62 can be provided either by potting or by transfer molding.

Manufacturing Method of Semiconductor Device

FIG. 5 shows a semiconductor device in accordance with an embodiment to which the present invention is applied and a method for fabricating the same. The semiconductor device has a configuration in which the tape-shaped semiconductor device shown in FIG. 5 is cut in a straight line extending in the widthwise direction. The tape-shaped semiconductor device can be cut on both sides of one interconnecting pattern 20, using a cutting tool 64 (such as a cutter or a punch), as shown in FIG. 5 by way of example. The cutting position may be that indicated by the broken line connected by two dots 48 in FIG. 1.

The semiconductor device in accordance with this embodiment of the invention may be formed by punching out the base substrate 10 of the above-described tape-shaped semiconductor device. The punching may be carried out along the outline surrounding one interconnecting pattern 20.

Semiconductor Device and Circuit Board

Figure 6:
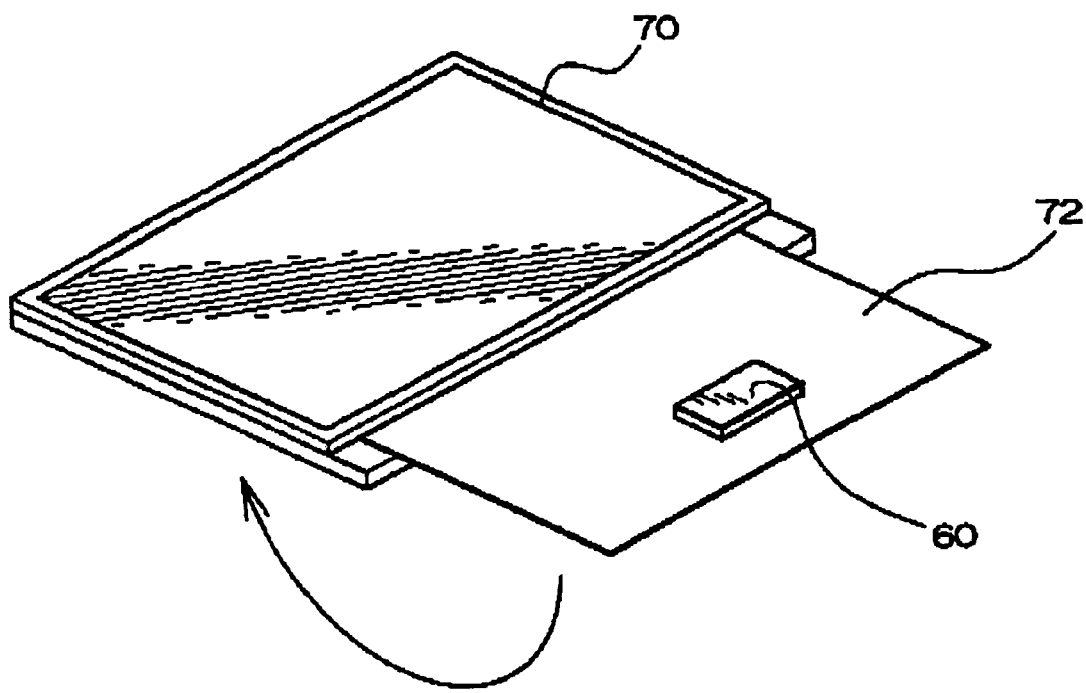
FIG. 6 shows a circuit board in accordance with an embodiment to which the present invention is applied.

FIG. 6 shows a circuit board in accordance with an embodiment to which the present invention is applied. As shown in FIG. 6, a semiconductor device 72 as described above is connected electrically to the circuit board 70. The circuit board 70 may be a liquid crystal panel, for example. The semiconductor device 72 is formed by punching out the base substrate 10 of the tape-shaped semiconductor device around the outline that encompasses the semiconductor chip 60.

The base substrate 10 of the semiconductor device 72 can also be formed bent as shown in FIG. 6. For example, the base substrate 10 may be made to bend around an end portion of the circuit board 70.

Electronic Equipment

Figure 7:
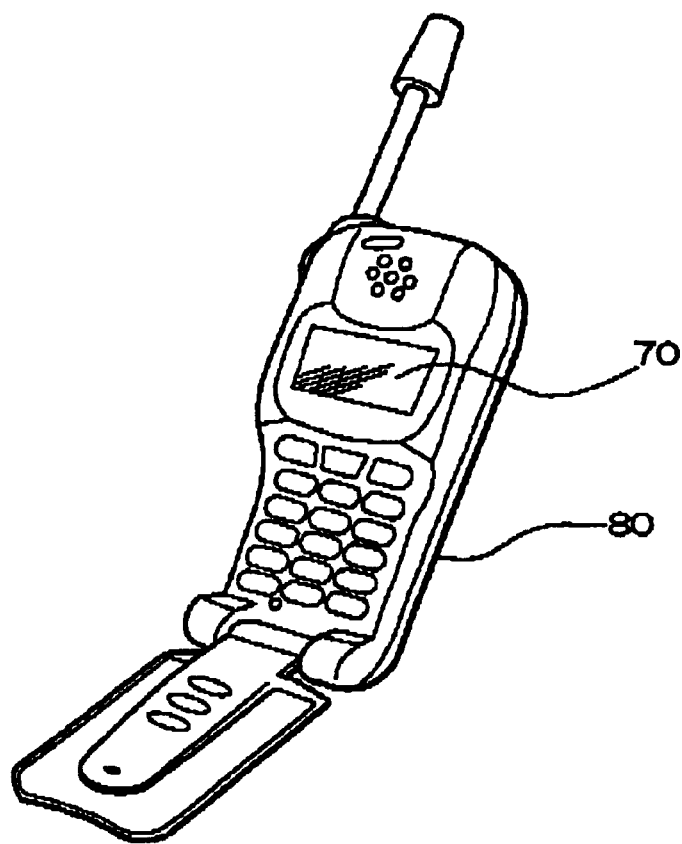
FIG. 7 shows electronic equipment that has a semiconductor device in accordance with an embodiment to which the present invention is applied.
Figure 8:
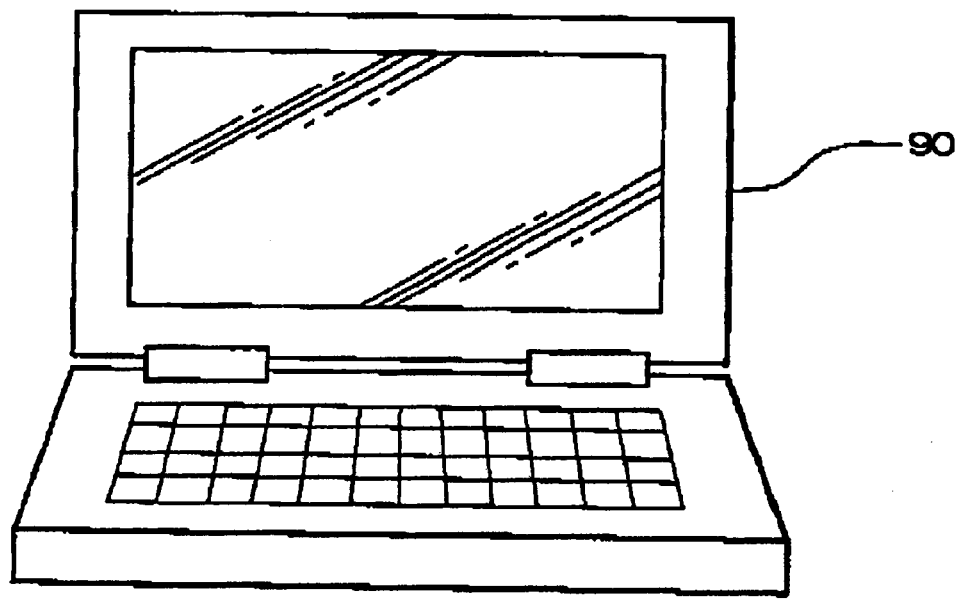
FIG. 8 shows electronic equipment that has a semiconductor device in accordance with an embodiment to which the present invention is applied.

A cellular phone 80 is shown in FIG. 7 as an example of electronic equipment having a semiconductor device to which the present invention is applied. This cellular phone 80 has the circuit board 70 (a liquid crystal panel) to which the present invention is applied. A notebook-sized personal computer 90 having a semiconductor device (not shown in the figure) to which the present invention is applied is shown in FIG. 8.

Note that the "semiconductor chip" that is a constitutional component of the present invention as described above could be replaced by an "electronic element" to fabricate a piece of electronic equipment in the same manner by mounting such an electronic element (either an active element or passive element) on a flexible interconnecting substrate instead of the semiconductor chip. Examples of electronic equipment fabricated by using such electronic elements include, optical elements, resistors, capacitors, coils, oscillators, filters, temperature sensors, thermistors, varistors, variable resistors, and fuses, by way of example.

Modification

Figure 9:
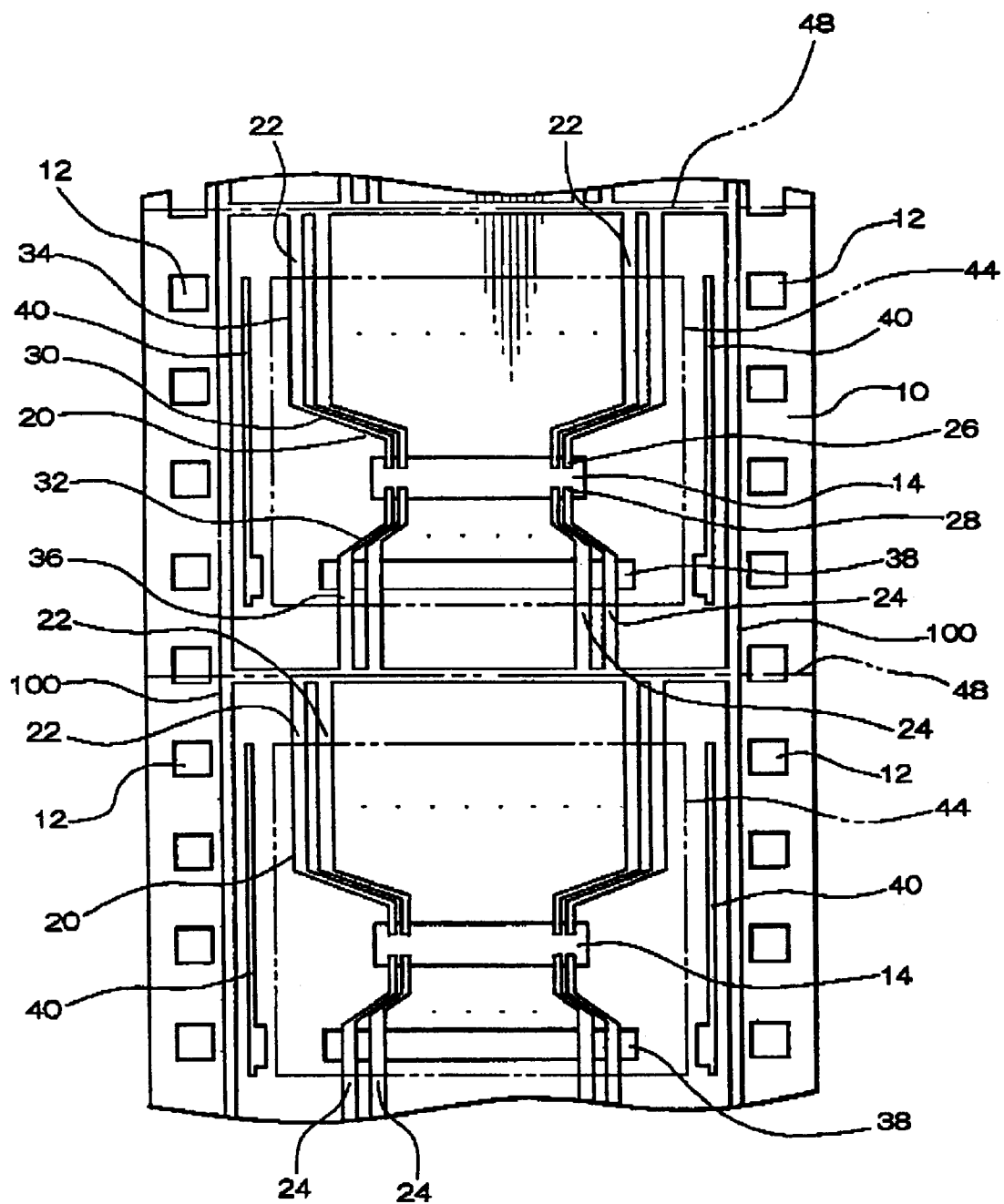
FIG. 9 shows a flexible interconnecting substrate in accordance with a modified embodiment to which the present invention is applied.

FIG. 9 is a drawing showing a modification of the above-described embodiments of the present invention. A plating lead 100 is formed on the flexible interconnecting base substrate shown in FIG. 9. The plating lead 100 is connected to interconnecting patterns 20 and used when electrically plating the interconnecting patterns 20. Otherwise, the flexible interconnecting substrate is the same as the flexible interconnecting substrate 1 shown in FIG. 1.

The plating lead 100 is continuously formed along the periphery of the base substrate 10. In this instance, the base substrate 10 is reinforced by the plating lead 100. In this embodiment, the base substrate 10 is reinforced also by reinforcing sections 40. Therefore, the base substrate 10 is reinforced by a stronger force in the areas in which the reinforcing sections 40 are formed. Details of the reinforcing sections 40 are the same as described in the above embodiments.

In FIG. 9, sprocket holes 12, the plating lead 100, and the reinforcing sections 40 are formed in this order from the edge portions of the base substrate 10 toward the center. The position of the plating lead 100 and the reinforcing sections 40 may be replaced.

Figure 10:
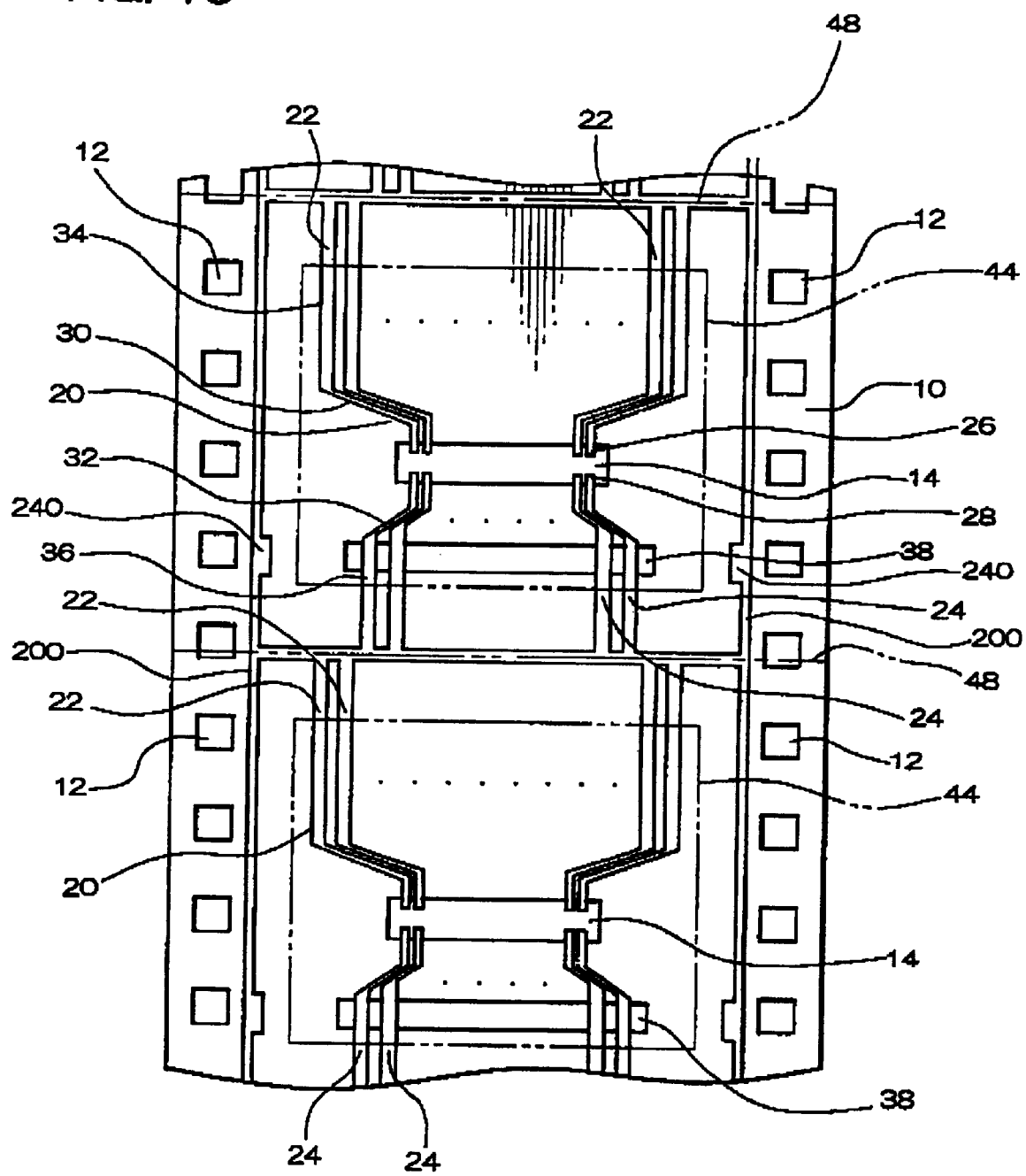
FIG. 10 shows a flexible interconnecting substrate in accordance with a modified embodiment to which the present invention is applied.

FIG. 10 is also a drawing showing a modification of the above-described embodiments of the present invention. A plating lead 200 is formed on the flexible interconnecting base substrate shown in FIG. 10. The plating lead 200 is connected to interconnecting patterns 20 and used when electrically plating the interconnecting patterns 20.

In this embodiment, the plating lead 100 is continuously formed along the periphery of the base substrate 10. The plating lead has a wide part and a narrow part, and the wide part forms reinforcing sections 240. In the embodiment shown in FIG. 10, the reinforcing sections 240 are formed in the area between the both ends of the holes (outer lead holes, for example), and are broader and stronger than other areas of the plating lead 200.

In this modified embodiment, the base substrate 10 is reinforced by the plating lead 200. Part of the plating lead 200 becomes the reinforcing sections 240, which strengthen reinforcing of the base substrate 10. Bending of the part of the interconnecting patterns 20 located inside the outer lead holes 38 can be suppressed due to the reinforcing sections 240. Otherwise, the flexible interconnecting substrate is the same as the flexible interconnecting substrate 1 shown in FIG. 1.

Figure 11:
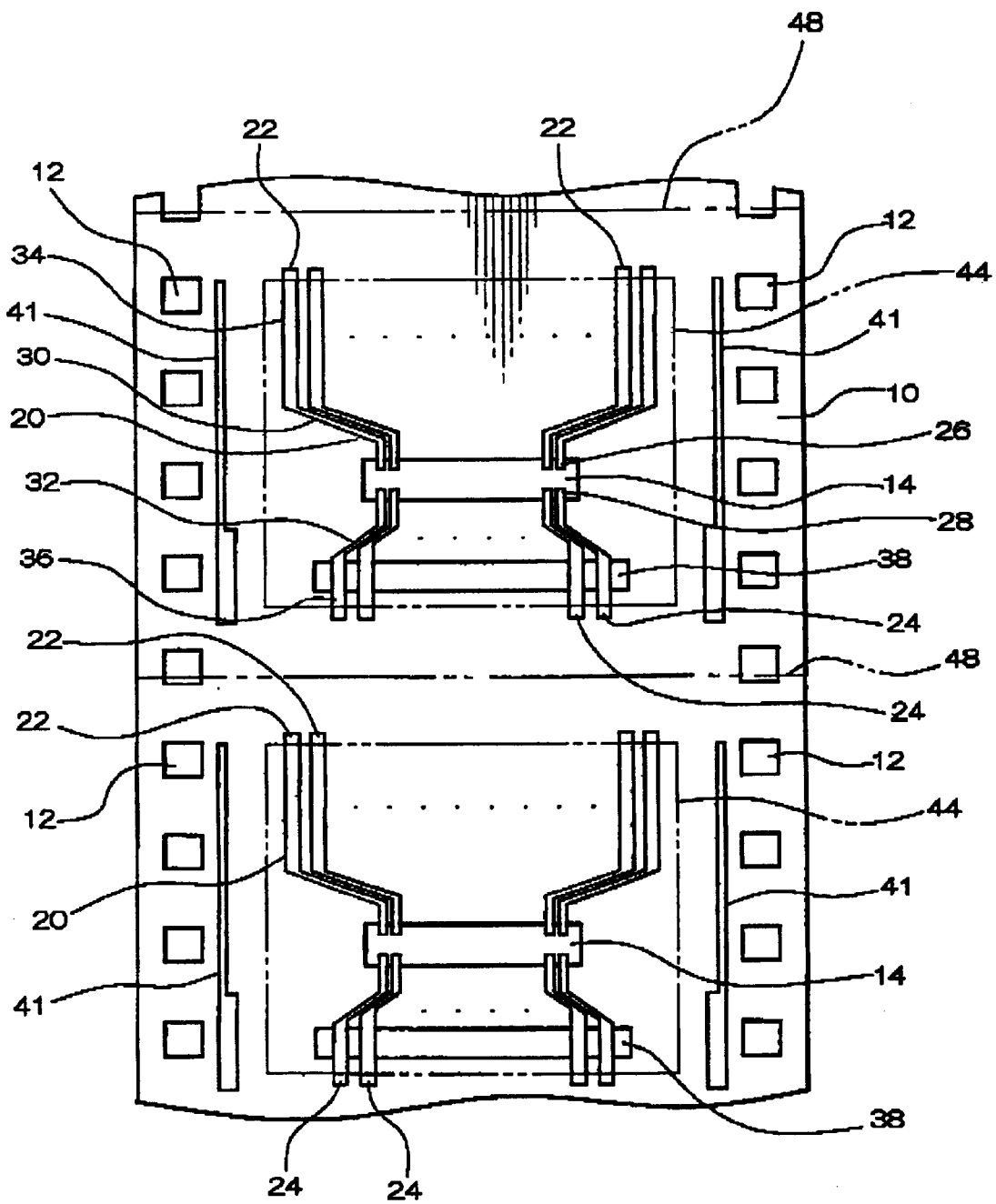
FIG. 11 shows a flexible interconnecting substrate in accordance with a modified embodiment to which the present invention is applied.

FIG. 11 is a drawing showing a modification of the embodiment shown in FIG. 1. In the embodiment shown in FIG. 1, the wide portion of the reinforcing section 40 has a length of the entire length of the outer lead hole 38 in the base substrate 10 in the longitudinal direction. In the embodiment shown in FIG. 11, on the other hand, the wide portion of the reinforcing section 41 is formed beyond the entire length of the outer lead hole 38 in the base substrate 10 in the longitudinal direction. This configuration is also included in the present invention.

Figure 12:
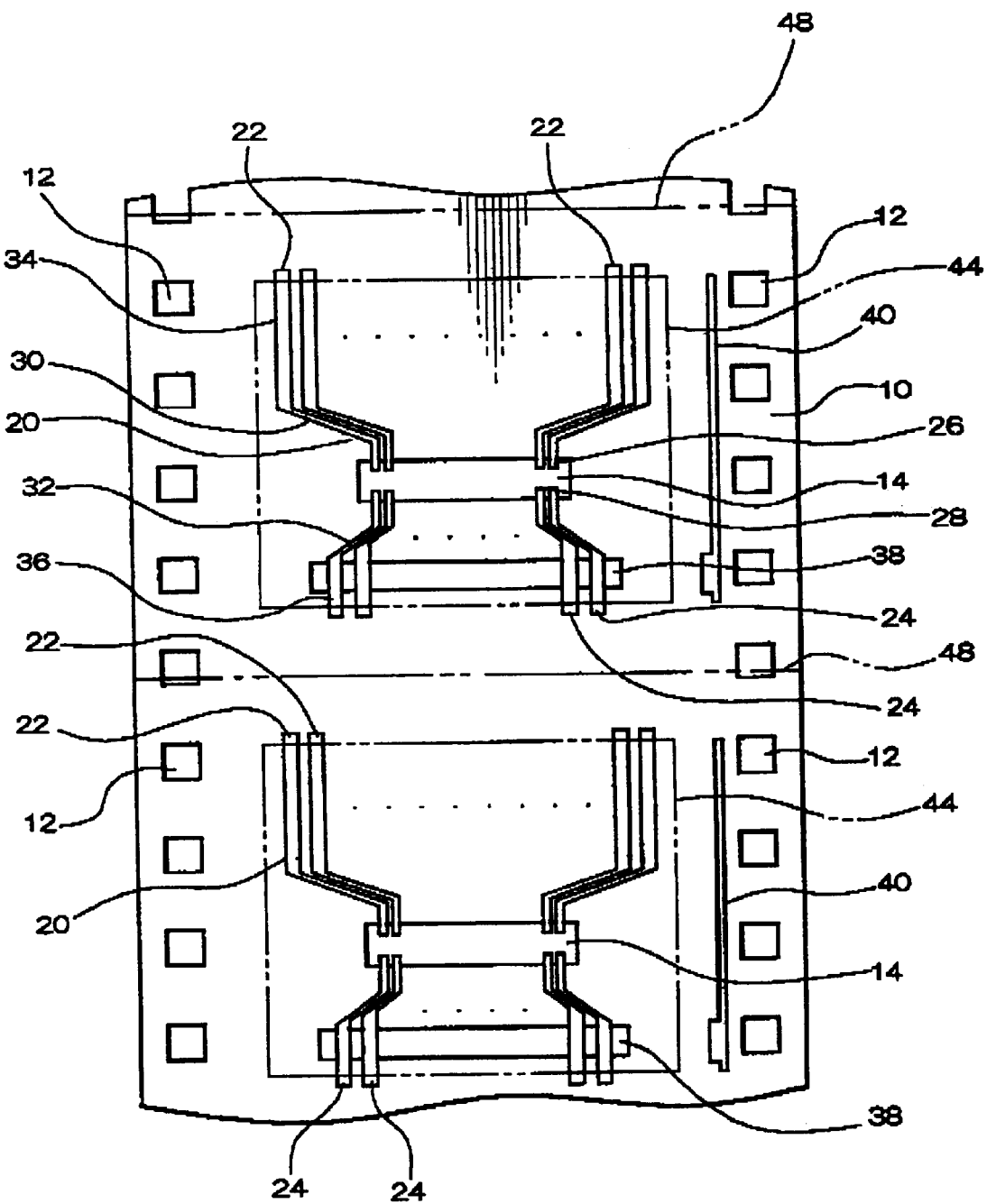
FIG. 12 shows a flexible interconnecting substrate in accordance with a modified embodiment to which the present invention is applied.

FIG. 12 is a drawing showing another modification of the embodiment shown in FIG. 1. In the embodiment shown in FIG. 1, the reinforcing sections 40 are formed along the both edge portions in the widthwise direction of the base substrate 10, whereas the modification shown in FIG. 12 has the reinforcing sections 40 along one edge portion in the widthwise direction of the base substrate 10.

In the embodiment shown in FIG. 12, a plurality of reinforcing sections 40 is formed on the side of one edge portion (the right side) of the base substrate 10, along the longitudinal direction of the base substrate 10. In the modified embodiment shown in FIG. 13, reinforcing sections 40 are alternately formed along either one of the edge portions of the base substrate 10. Specifically, a reinforcing section 40 is formed along one edge portions (the right side, for example) of the base substrate 10, and a next reinforcing section 40 is formed along the other edge portion (the left side, for example) of the base substrate 10.

Figure 13:
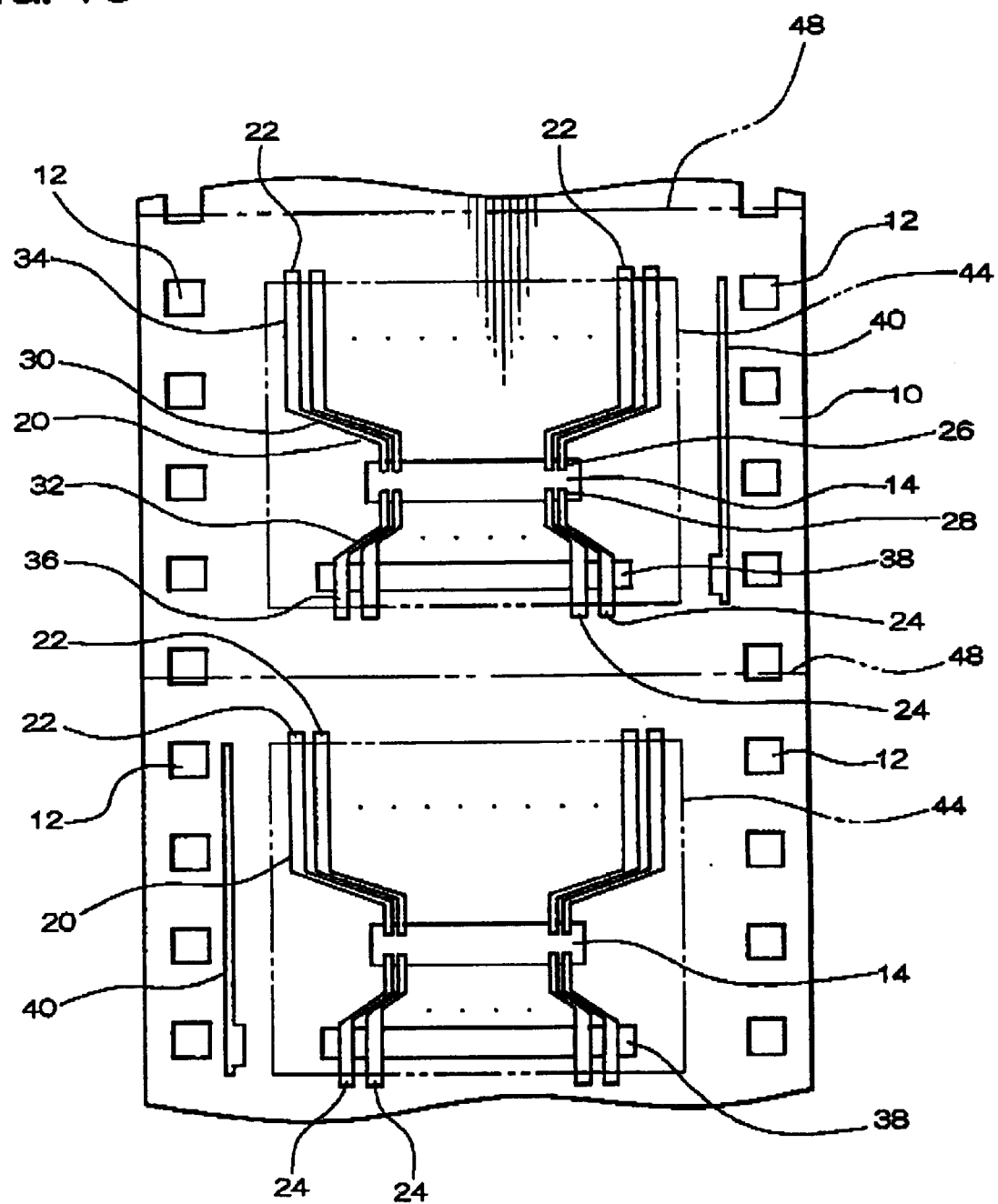
FIG. 13 shows a flexible interconnecting substrate in accordance with a modified embodiment to which the present invention is applied.

In the same manner, the reinforcing sections 41 shown in the modified embodiment of FIG. 11 may be formed as shown in FIG. 12 or 13. This configuration is also included in the present invention.

Figure 14:
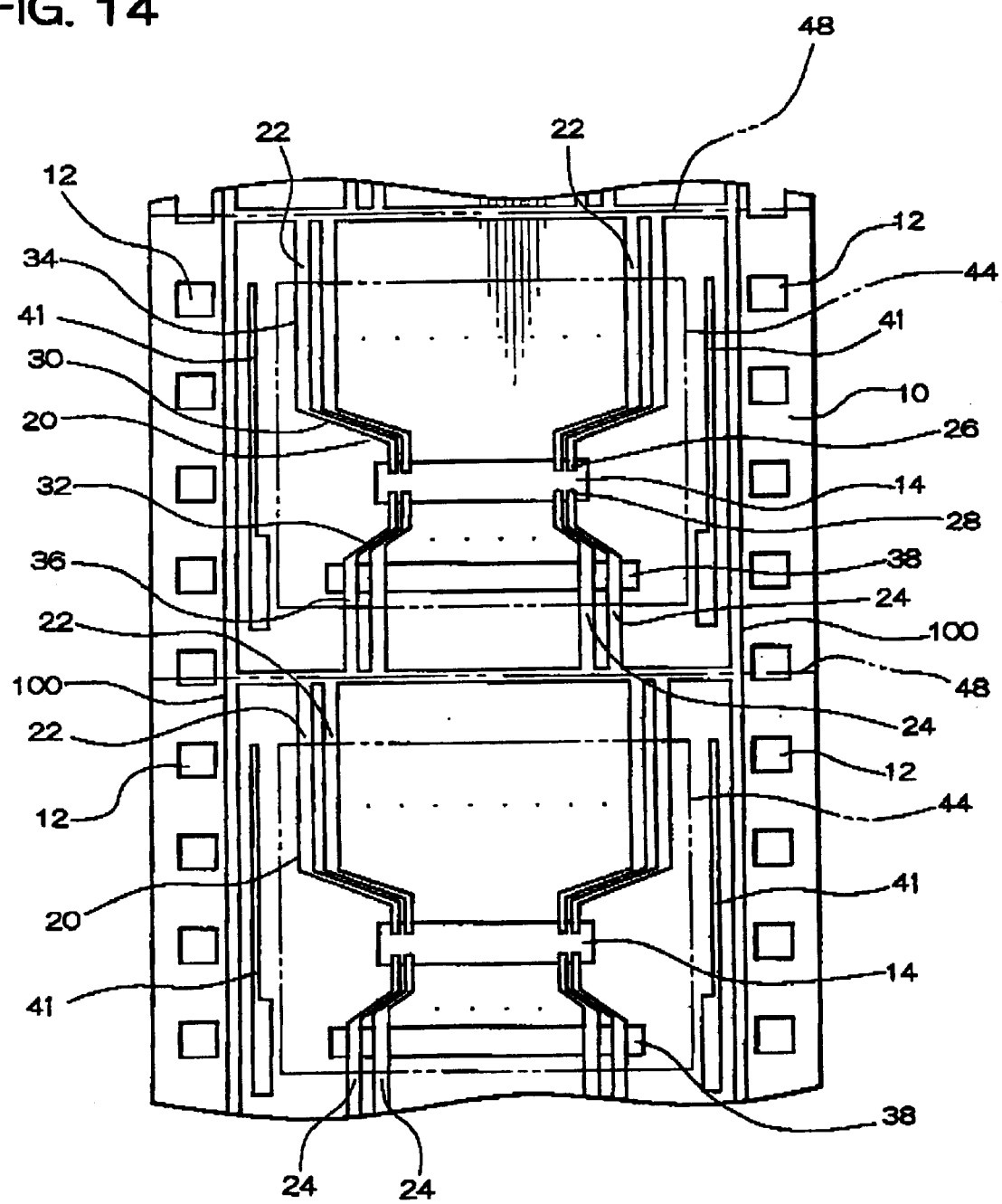
FIG. 14 shows a flexible interconnecting substrate in accordance with a modified embodiment to which the present invention is applied.

FIG. 14 is a drawing showing a modification of the embodiment shown in FIG. 9. In the embodiment shown in FIG. 9, the wide portion of the reinforcing section 40 has a length of the entire length of the outer lead hole 38 in the base substrate 10 in the longitudinal direction. In the embodiment shown in FIG. 14, on the other hand, the wide portion of the reinforcing section 41 is formed beyond the entire length of the outer lead hole 38 in the base substrate 10 in the longitudinal direction. This configuration is also included in the present invention.

Figure 15:
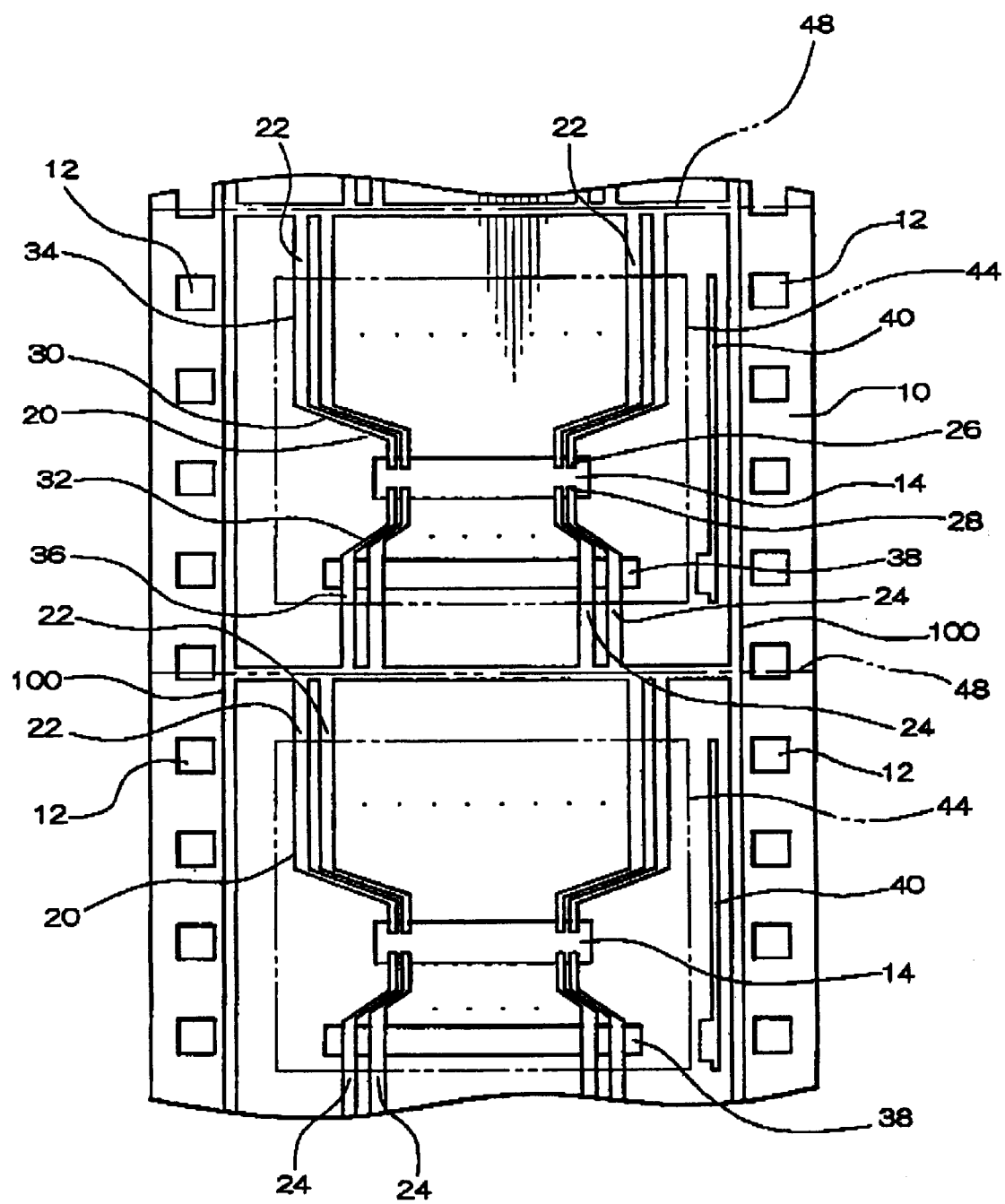
FIG. 15 shows a flexible interconnecting substrate in accordance with a modified embodiment to which the present invention is applied.

FIG. 15 is a drawing also showing a modification of the embodiment shown in FIG. 9. In the embodiment shown in FIG. 9, the reinforcing sections 40 are formed along the both edge portions in the widthwise direction of the base substrate 10, whereas the modification shown in FIG. 12 has the reinforcing sections 40 along one edge portion in the widthwise direction of the base substrate 10.

In the embodiment shown in FIG. 12, a plurality of reinforcing sections 40 is formed along one edge portion (the right side) of the base substrate 10, arranging in the longitudinal direction of the base substrate 10. In the modified embodiment shown in FIG. 13, reinforcing sections 40 are alternately formed along either one of the edge portions of the base substrate 10. Specifically, a reinforcing section 40 is formed along edge portion (the right side, for example) of the base substrate 10, and a next reinforcing section 40 is formed along the other edge portion (the left side, for example) of the base substrate 10.

Figure 16:
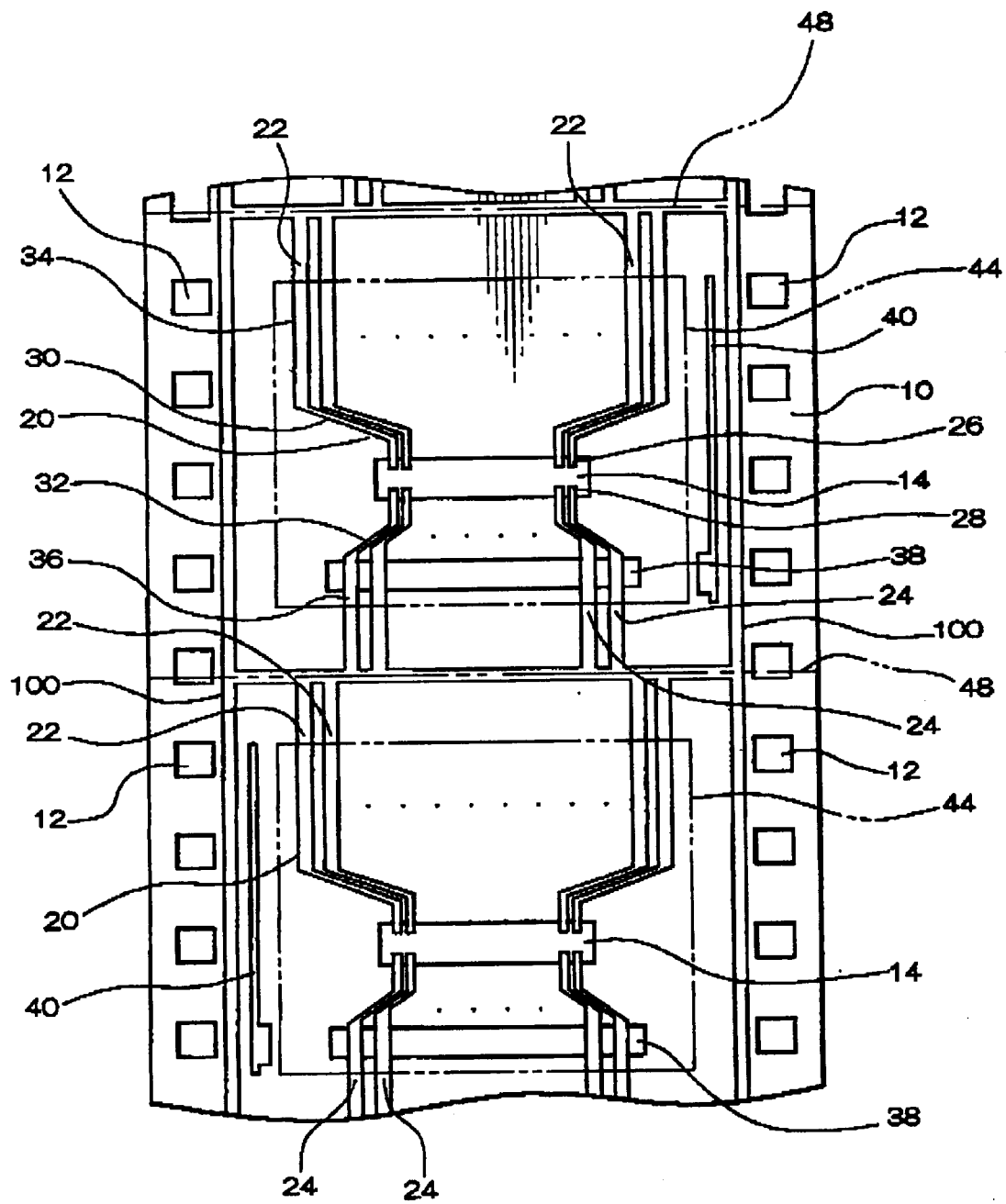
FIG. 16 shows a flexible interconnecting substrate in accordance with a modified embodiment to which the present invention is applied.

In the same manner, the reinforcing sections 41 shown in the modified embodiment of FIG. 14 may be formed as shown in FIG. 15 or 16. This configuration is also included in the present invention.

Figure 17:
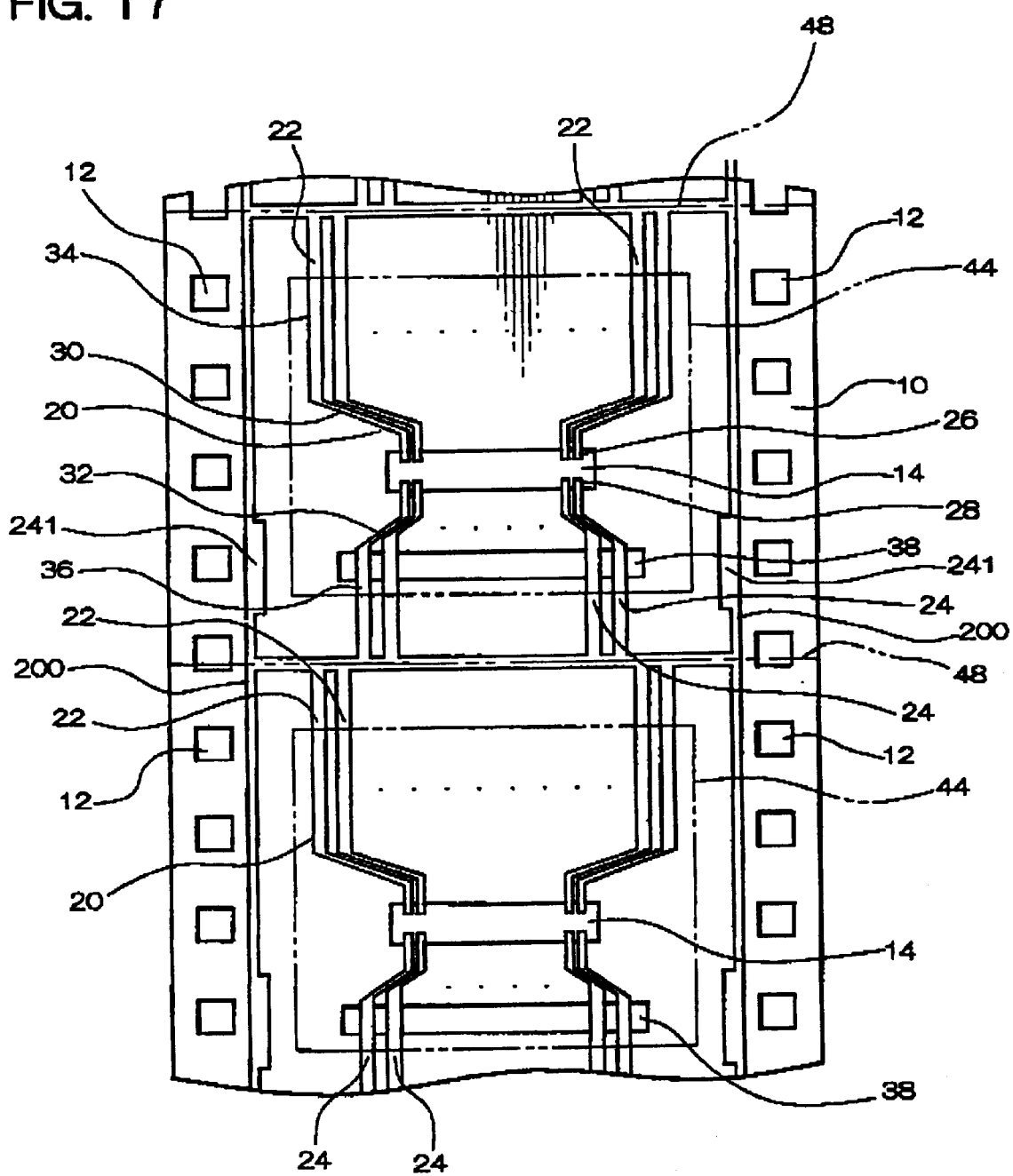
FIG. 17 shows a flexible interconnecting substrate in accordance with a modified embodiment to which the present invention is applied.

FIG. 17 is a drawing showing a modification of the embodiment shown in FIG. 10. In the embodiment shown in FIG. 10, the reinforcing section 240 has a length of the entire length of the outer lead hole 38 in the base substrate 10 in the longitudinal direction. In the embodiment shown in FIG. 17, on the other hand, the reinforcing section 241 is formed beyond the entire length of the outer lead hole 38 in the base substrate 10 in the longitudinal direction. This configuration is also included in the present invention.

Figure 18:
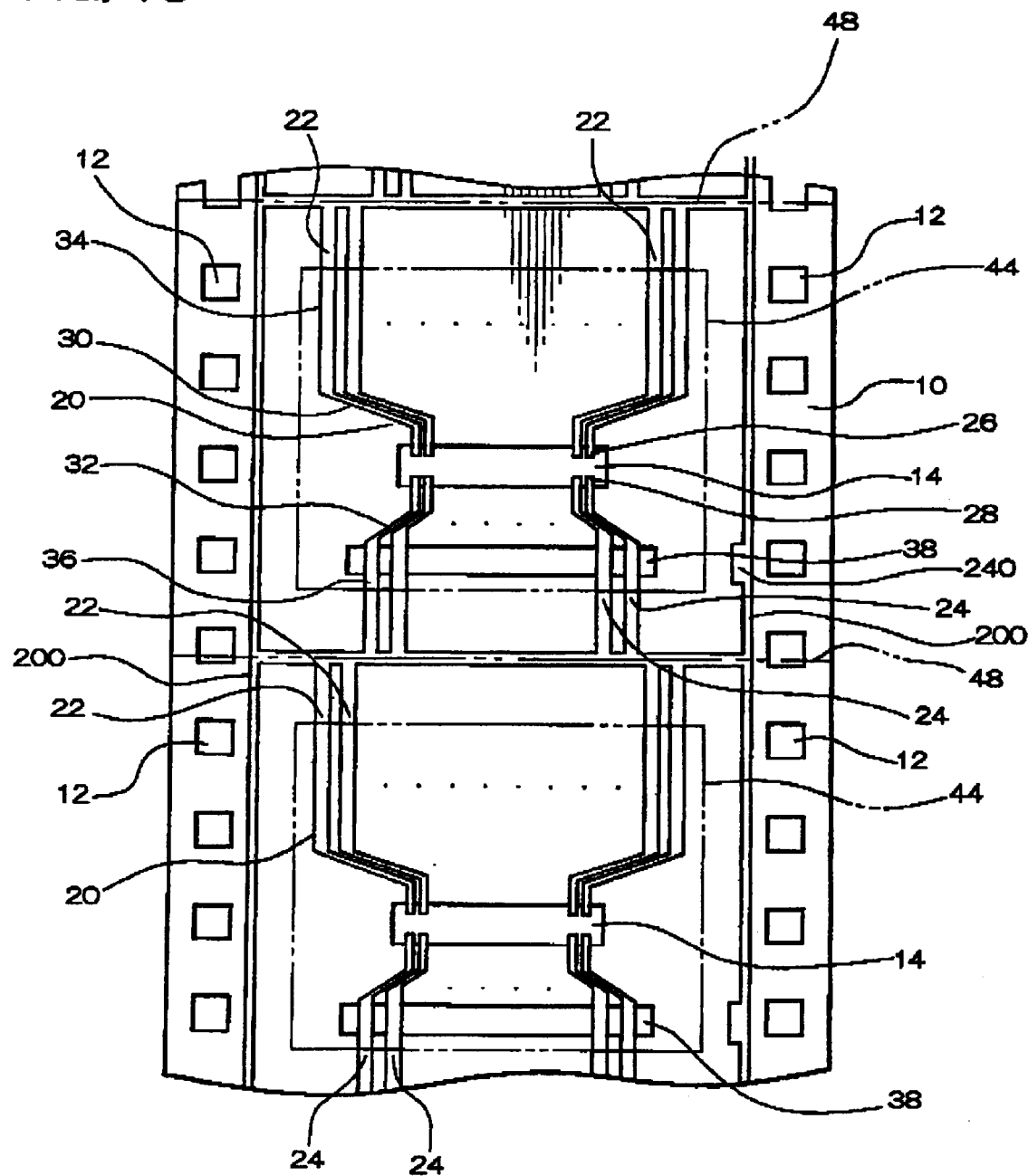
FIG. 18 shows a flexible interconnecting substrate in accordance with a modified embodiment to which the present invention is applied.

FIG. 18 is a drawing also showing a modification of the embodiment shown in FIG. 10. In the embodiment shown in FIG. 10, the reinforcing sections 240 are formed along the both edge portions in the widthwise direction of the base substrate 10, whereas the modification shown in FIG. 18 has the reinforcing sections 240 along edge portion in the widthwise direction of the base substrate 10.

In the embodiment shown in FIG. 18, a plurality of reinforcing sections 240 is formed along one edge portion (the right side) of the base substrate 10, arranging in the longitudinal direction of the base substrate 10. In the modified embodiment shown in FIG. 19, reinforcing sections 240 are alternately formed along either one of the edge portions of the base substrate 10. Specifically, a reinforcing section 240 is formed along one edge portion (the right side, for example) of the base substrate 10, and a next reinforcing section 240 is formed along the other edge portion (the left side, for example) of the base substrate 10.

Figure 19:
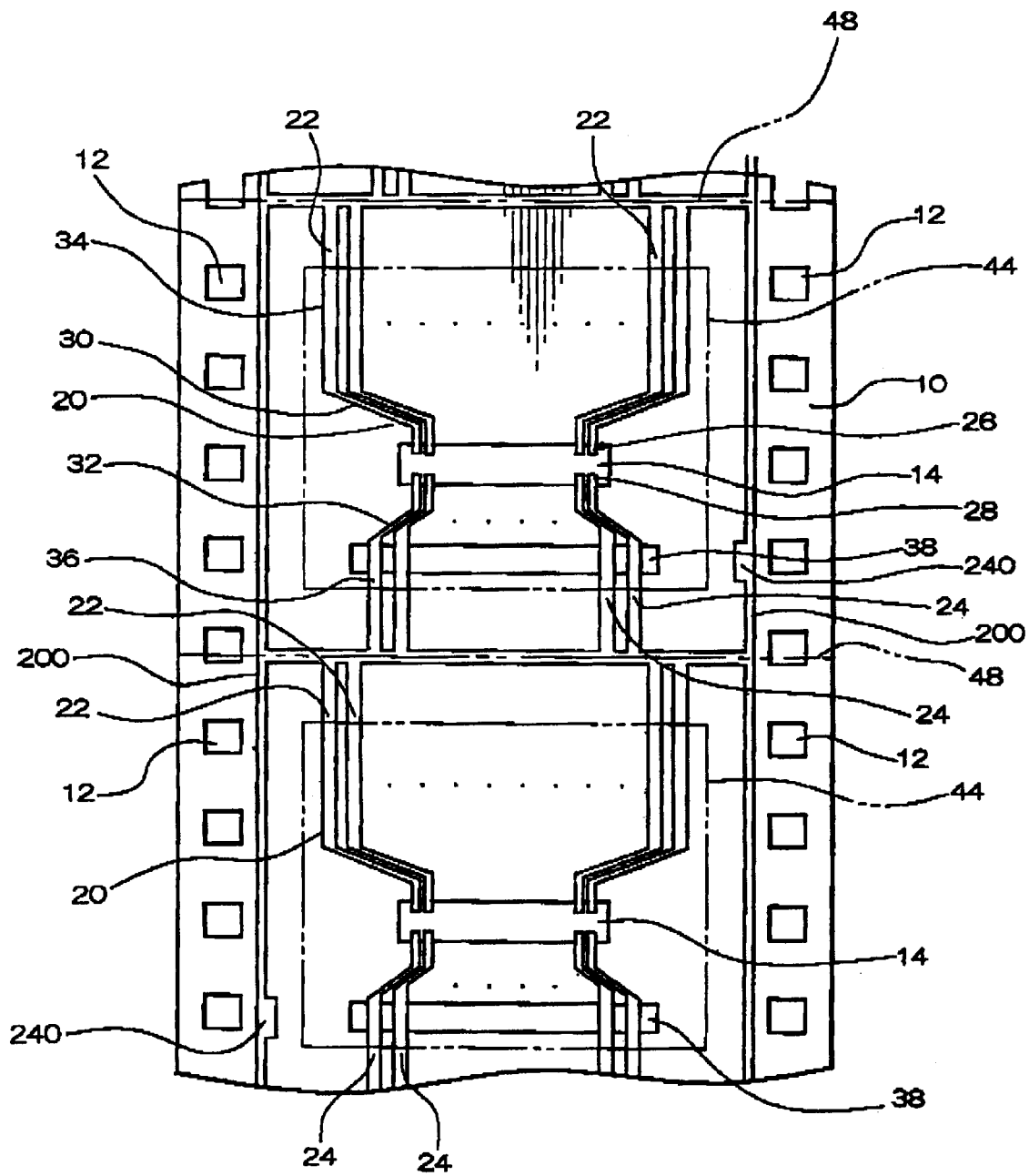
FIG. 19 shows a flexible interconnecting substrate in accordance with a modified embodiment to which the present invention is applied.

In the same manner, the reinforcing sections 241 shown in the modified embodiment of FIG. 17 may be formed as shown in FIG. 18 or 19. This configuration is also included in the present invention.

EXAMPLES

A film carrier tape using the present invention will be described. A film carrier tape (an example of the flexible interconnecting substrate 1) may be a flexible elongate substrate (an example of the base substrate 10) shown in FIG. 1. After forming device holes 12 and outer lead holes 38 in the elongate substrate by punching, interconnecting patterns 20 are formed around these holes.

The elongate substrate is made from a polyimide film, with a plurality of sprocket holes 12 provided along the longitudinal direction of the substrate. The elongate substrate can be moved in the transferring direction by causing the sprocket holes 12 to engage the sprockets which are provided in the transferring route.

A plurality of punching regions 44, each corresponding to the punching contour of the film carrier, is formed at predetermined intervals along the longitudinal direction of the elongate substrate.

A device hole 14 with a size large enough to include the semiconductor chip 60 (see FIG. 4) and an outer lead hole 38 close to the device hole 14 are provided inside the punching regions 44. Interconnecting patterns 20 are formed between the device hole 14 and outer lead hole 38. One end of the interconnecting patterns 20 projects from the edge of the device hole 14 as an inner lead 28 on the input side, thereby ensuring connection with the terminals (electrodes) which are formed on the surface of the semiconductor chip 60. The interconnecting patterns 20 are formed across the outer lead hole 38. Part of the interconnecting patterns 20 which is present across the outer lead hole 38 is an outer lead which connects with the terminals formed on an outer board which is not shown in the Figure.

On the other hand, an inner lead 26 on the output side is formed in the opposite edge in which the inner lead 28 on the input side for the device hole 14 is formed. The number of inner leads 26 on the output side corresponding to the number of terminals for the semiconductor chip 60 also projects. The interconnecting patterns 20 of which the one end is the inner lead 26 on the output side extend to the opposing side on which the outer lead hole 38 is formed. The extended end portion is plated by solder to ensure connection to the other outer board, thereby forming a solder land.

A dummy pattern (an example of the reinforcing section 40) which prevents the punching region 44 from bending is formed in the crossing region (the region in the widthwise direction) of the elongate substrate including the punching region 44. The dummy pattern is formed extending on both sides of the punching region 44 in the longitudinal direction of the elongate substrate. The material is the same copper foil as used for the interconnecting patterns 20. The dummy pattern is formed with a large width particularly around the outside of the outer lead hole 38 to increase the bending resistance. Specifically, the elongate substrate generally has a thickness of 50 $\mu$m or 75 $\mu$m, and a copper foil (the material for the interconnecting pattern 20 and dummy pattern) which is formed on the surface of this elongate substrate generally has a thickness from 18 to 35 $\mu$m. If formed with a large width, such a copper foil can increase the bending resistance in the region where the copper foil has been formed. The width of the dummy pattern in the wide region is larger than the width of the outer lead hole 14 to make sure that the wide region of the dummy pattern overlaps the wide region of the outer lead hole 38, whereby the bending resistance around the outer lead hole 38 is increased.

The film carrier tape is formed by punching out the device hole 14 and outer lead hole 38 simultaneously from the elongate substrate, following which a copper foil is laminated on the surface of the elongate substrate and subjected to exposure and etching treatment to form interconnecting patterns 20 and dummy patterns. The film carrier tape thus fabricated is then subjected to a process for the manufacture of semiconductor devices mounted thereon. Such a process comprises placing a semiconductor chip 60 in the device hole 14, providing electric conductance with inner leads 26 and 28, sealing the semiconductor chip 60 with a protective resin (an example of the protective film 42), and punching out the film carrier along the outer contour of the punching region 44.

A series of steps in the fabrication process are not carried out in one process line along the transfer direction of the longitudinal substrate. Each step has an individual process line. At the end of a predetermined process line, the film carrier tape is wound onto a reel 46. This reel 46 is installed at the top of the next process line to play out the film carrier tape to the next process line.

When the tip of the film carrier tape is attached to the core of the reel 46 and the tape is wound onto the core as shown in FIG. 2A, the film carrier tape becomes a roll. The roll increases its diameter as the amount of the film carrier tape wound onto the reel increases. In this instance, bending stress is applied to the film carrier tape as it is wound onto the reel 46. However, because the film carrier tape is provided with dummy patterns and a wide region in both sides of the outer lead hole 38, the bending stress is reduced in these regions. Because of this, the areas other than the punching region 44 have a smaller bending resistance than the punching region 44. Therefore, the bending stress is concentrated in these areas, causing the film carrier tape to assume a polygon-like configuration with apexes of such areas other than the punching region 44 of the polygon, as shown in FIG. 2B which is an enlarged view of FIG. 2A. Accordingly, there is no bending stress concentrated in the area where the outer lead hole 38 is formed. Therefore, the case where the bending stress is concentrated in the outer leads formed in the outer lead hole 38 is avoided and occurrence of cracks and breakage is prevented.

FIG. 3 is a drawing showing an embodiment of the process line for mounting a semiconductor chip 60 on a film carrier tape. As shown in FIG. 3, the film carrier tape played out from the reel 46 is placed under the bonding unit 50 in the process line, where the semiconductor chip 60 is mounted on the film carrier tape. A buffer region (slack) 52 is provided between the real 46 and bonding unit 50 so that the amount of the film carrier tape played out from the reel 46 need not be synchronized with the tact time of the bonding unit 50 to mount the semiconductor chip 60 on the film carrier tape.

Because the film carrier tape is suspended by its own weight in the buffer region 52, the lowest part is bent by this weight. Bending stress is thus applied to the film carrier tape. The film carrier tape is provided with a punching region 44, in which the bending resistance is larger than in the other areas because of the provision of a dummy pattern (particularly, wide area). As a result, the bending stress is concentrated in areas other than the punching region 44. The film carrier tape thus forms a polygon-like configuration having such areas other than the punching region 44 as polygon apexes. Accordingly, there is no bending stress concentrated in the area where the outer lead hole 38 is formed. Therefore the case where the bending stress is concentrated in the outer leads formed in the outer lead hole 38 is avoided and occurrence of cracks and breakage is prevented.

In addition, because the bending stress is concentrated in areas other than the punching region 44, concentration of bonding stress in the punching region 44 can be avoided. Because of this, there is no risk of deformation or the like created not only in the outer lead, but also in the inner lead 28 on the input side and the inner lead 26 on the output side which are formed inside the punching region 44. Positioning of the inner lead 26, 28 and the semiconductor chip 60 can thus be ensured without fail.

After the semiconductor chip 60 is installed on the film carrier tape, the punching region 44 is punched out along its outer contour to fabricate a semiconductor device. Because the dummy pattern is formed outside the punched region 44, almost no dummy pattern is left on the semiconductor device side after punching out. Because of this, part of the dummy pattern which is electrically independent functions as an antenna to prevent neighboring interconnecting patterns 20 from being affected by noise due to mutual induction. When the effect of such noise interference is small, the dummy pattern may be formed extending inside the punching region 44, thereby increasing the bending resistance.

As described in connection with the process for mounting the semiconductor chip 60 on the film carrier tape, the same effect is also obtained in other regions of the film carrier tape to which the bending stress is applied.

Although the dummy pattern in this embodiment is provided in the longitudinal direction of the punching region 44, this is not limited in the present invention. For instance, when the bending resistance in the areas other than the outer lead hole 38 in the punching region 44 is sufficient, provision of a wide portion having a length of the entire length of the hole (e.g. outer lead hole 38) may be adequate. In addition, reinforcement of the punching region 44 may be achieved not only by means of a copper foil which composes an interconnecting pattern 20, but also by coating a resist or by applying a reinforcing plate (including a reinforcing film) to the back of the punching region 44.

As described above, in the method of fabricating the film carrier tape according to the present embodiment, after continuously providing punching regions 44 in the longitudinal direction of a flexible elongate substrate, the crossing region (a region in the widthwise direction) of the elongate substrate which contains the punching region 44 is reinforced, whereby the degree of bending in the punching region 44 can be decreased.

Specifically, punching regions 44 are sequentially provided in the longitudinal direction of a flexible elongate substrate, then a device hole 14 is provided within each punching region 44 and an outer lead hole 38 is provided adjacent thereto. Thereafter, an interconnecting pattern 20 is formed by causing one end portion to project from the device hole 14 and the other end portion to cross over the outer lead hole 38. Because a dummy pattern (reinforcing section 40) is formed together with the interconnecting pattern 20, concentration of the bending stress in the outer lead hole 38 area can be avoided, and occurrence of cracks and breakage can be prevented.

In the film carrier tape according to the present embodiment, which has a flexible elongate substrate, punching regions 44 are sequentially provided in the longitudinal direction of the elongate substrate, as well as reinforcing sections 40. Therefore the degree of bending in the punching regions 44 can be decreased by causing the bending resistance in the punching region 44 to be larger than the bending resistance in the other area.

Specifically, the film carrier tape has a flexible elongate substrate, wherein punching regions 44 are sequentially provided in the longitudinal direction, and each punching region 44 is provided with a device hole 14 therein and an outer lead hole 38 adjacent thereto. The film carrier tape also has interconnecting patterns 20 of which one end portion projects from the device hole 14 and the other end portion crosses the outer lead hole 38, and a dummy pattern (reinforcing section 40). This constitution can avoid concentration of the bending stress in the outer lead hole 38 area, and prevents occurrence of cracks and breakage.

What is claimed is:

1. A flexible interconnecting substrate comprising:
    a tape-shaped base substrate;
    interconnecting patterns formed on the base substrate; and
    reinforcing sections formed on the base substrate, the reinforcing sections electrically disconnected from the interconnecting patterns,
        wherein each of the reinforcing sections is formed along the longitudinal direction of the base substrate, and
        wherein at least part of each of the interconnecting patterns is formed in a position away from each of the reinforcing sections in the widthwise direction of the base substrate.

2. The flexible interconnecting substrate as defined in claim 1,
    wherein holes are formed in the base substrate, and
    wherein at least part of each of the reinforcing sections is formed in a position away from each of the holes in the widthwise direction of the base substrate.

3. The flexible interconnecting substrate as defined in claim 2,
    wherein the holes are formed in the base substrate with predetermined interval in the longitudinal direction.

4. The flexible interconnecting substrate as defined in claim 2,
    wherein part of each of the interconnecting patterns is placed in the holes.

5. The flexible interconnecting substrate as defined in claim 1,
    wherein the reinforcing sections are formed along an edge portion in the widthwise direction of the base substrate, and
    wherein the interconnecting patterns are formed in a center in the widthwise direction of the base substrate.

6. The flexible interconnecting substrate as defined in claim 1,
    wherein the reinforcing sections are formed from the same material as the interconnecting patterns.

7. The flexible interconnecting substrate as defined in claim 1,
    wherein the base substrate includes regions to be punched out, and
    wherein the interconnecting patterns are formed in the regions to be punched out.

8. The flexible interconnecting substrate as defined in claim 7,
    wherein each of the reinforcing sections is formed along the entire length of each of the regions to be punched out in the longitudinal direction of the base substrate.

9. The flexible interconnecting substrate as defined in claim 7,
    wherein the reinforcing sections are formed outside the region to be punched out.

10. A method of manufacturing a semiconductor device comprising the steps of:
    winding a tape-shaped semiconductor device which includes the flexible interconnecting substrate as defined in claim 7 and semiconductor chips connected electrically to the interconnecting patterns of the flexible interconnecting substrate, onto a real in preparation;
    pulling the tape-shaped semiconductor device out from the reel; and then
    punching out the flexible interconnecting substrate in the region to be punched out.

11. The flexible interconnecting substrate as defined in claim 1,
    wherein a plating lead is formed on the base substrate.

12. The flexible interconnecting substrate as defined in claim 11,
    wherein the plating lead is formed separately from the reinforcing sections.

13. A tape-shaped semiconductor device comprising:
    the flexible interconnecting substrate as defined in claim 1; and
    semiconductor chips connected electrically to the interconnecting patterns of the flexible interconnecting substrate.

14. A semiconductor device which has a shape obtained by punching-out the base substrate of the tape-shaped semiconductor device as defined in claim 13, along an outline that surrounds one of the semiconductor chips.

15. A circuit board to which the semiconductor device as defined in claim 14 is connected electrically.

16. Electronic equipment having the semiconductor device as defined in claim 14.

17. A method of manufacturing a semiconductor device comprising the steps of:
    winding the flexible interconnecting substrate as defined in claim 1 onto a reel in preparation, and then
    pulling the flexible interconnecting substrate out from the reel.

18. A method of manufacturing a semiconductor device comprising the steps of:
    winding a tape-shaped semiconductor device which includes the flexible interconnecting substrate as defined in claim 1 and semiconductor chips connected electrically to the interconnecting patterns of the flexible interconnecting substrate, onto a real in preparation; and then
    pulling the tape-shaped semiconductor device out from the reel.

19. A flexible interconnecting substrate comprising:
    a tape-shaped base substrate in which holes are formed;
    interconnecting patterns formed on the base substrate; and
    reinforcing sections formed on the base substrate and formed along the longitudinal direction of the base substrate at a position away from the holes in the widthwise direction of the base substrate, the reinforcing sections electrically disconnected from the interconnecting patterns,
        wherein each of the reinforcing sections comprises a first portion formed in the both ends of each of the holes and a second portion formed beyond the both ends of each of the holes, the first portion having a higher strength than the second portion, and wherein at least part of each of the interconnecting patterns is formed in a position away from the reinforcing sections in the widthwise direction of the base substrate.

20. The flexible interconnecting substrate as defined in claim 19, wherein the reinforcing sections are formed from the same material as the interconnecting patterns and the first portion has a width greater than the second portion.

21. The flexible interconnecting substrate as defined in claim 19, wherein a plating lead is formed on the base substrate.

22. The flexible interconnecting substrate as defined in claim 21, wherein the plating lead is formed separately from the reinforcing sections.

23. A tape-shaped semiconductor device comprising:

the flexible interconnecting substrate as defined in claim 19; and semiconductor chips connected electrically to the interconnecting patterns of the flexible interconnecting substrate.

24. A semiconductor device which has a shape obtained by punching-out the base substrate of the tape-shaped semiconductor device as defined in claim 23, along an outline that surrounds one of the semiconductor chips.

25. A circuit board to which the semiconductor device as defined in claim 24 is connected electrically.

26. Electronic equipment having the semiconductor device as defined in claim 24.

27. A method of manufacturing a semiconductor device comprising the steps of:

winding the flexible interconnecting substrate as defined in claim 19 onto a reel in preparation, and then pulling the flexible interconnecting substrate out from the reel.

28. A method of manufacturing a semiconductor device comprising the steps of:

winding a tape-shaped semiconductor device which includes the flexible interconnecting substrate as defined in claim 10 and semiconductor chips connected electrically to the interconnecting patterns of the flexible interconnecting substrate, onto a real in preparation; and then pulling the tape-shaped semiconductor device out from the reel.

29. A flexible interconnecting substrate comprising:

a tape-shaped base substrate in which holes are formed;

interconnecting patterns formed on the base substrate and extending across the holes; and reinforcing sections formed on the base substrate, the reinforcing sections electrically disconnected from the interconnecting patterns, wherein each of the reinforcing sections is formed along the longitudinal direction of the base substrate, at a position away from each of the holes in the widthwise direction of the base substrate, and each of the reinforcing members has a length of at least the entire length of each of the holes in the longitudinal direction of the base substrate.

30. The flexible interconnecting substrate as defined in claim 29, wherein a plating lead is formed on the base substrate.

31. The flexible interconnecting substrate as defined in claim 30, wherein the plating lead is formed separately from the reinforcing sections.

32. A tape-shaped semiconductor device comprising:

the flexible interconnecting substrate as defined in claim 29; and semiconductor chips connected electrically to the interconnecting patterns of the flexible interconnecting substrate.

33. A semiconductor device which has a shape obtained by punching-out the base substrate of the tape-shaped semiconductor device as defined in claim 32, along an outline that surrounds one of the semiconductor chips.

34. A circuit board to which the semiconductor device as defined in claim 33 is connected electrically.

35. Electronic equipment having the semiconductor device as defined in claim 33.

36. A method of manufacturing a semiconductor device comprising the steps of:

winding the flexible interconnecting substrate as defined in claim 23 onto a reel in preparation, and then pulling the flexible interconnecting substrate out from the reel.

37. A method of manufacturing a semiconductor device comprising the steps of:

winding a tape-shaped semiconductor device which includes the flexible interconnecting substrate as defined in claim 12 and semiconductor chips connected electrically to the interconnecting patterns of the flexible interconnecting substrate, onto a real in preparation; and then pulling the tape-shaped semiconductor device out from the reel.

38. A film carrier comprising:

a base substrate;

an interconnecting pattern formed on the base substrate; and a reinforcing section formed on the base substrate, the reinforcing section electrically disconnected from the interconnecting pattern, wherein the reinforcing section is formed along the longitudinal direction of the base substrate, and wherein at least part of the interconnecting pattern is formed in a position away from the reinforcing section in the widthwise direction of the base substrate.

39. A semiconductor device comprising:

a base substrate;

an interconnecting pattern formed on the base substrate;

a reinforcing section formed on the base substrate, the reinforcing section electrically disconnected from the interconnecting pattern; and a semiconductor chip connected electrically to the interconnecting pattern, wherein the reinforcing section is formed along the longitudinal direction of the base substrate, and wherein at least part of the interconnecting pattern is formed in a position away from the reinforcing section in the widthwise direction of the base substrate.

40. A circuit board to which the semiconductor device as defined in claim 39 is connected electrically.

41. Electronic equipment having the semiconductor device as defined in claim 39.

42. A flexible interconnecting substrate comprising:

a tape-shaped base substrate in which holes are formed;

interconnecting patterns formed on the base substrate; and a plating lead formed along the longitudinal direction of the base substrate, the plating lead having first parts and second parts, each of the first parts wider than each of the second parts, each of the first parts formed at a position away from each of the holes in the widthwise direction of the base substrate, each of the first parts formed to have a length of at least the entire length of each of the holes in the longitudinal direction of the base substrate.

43. The flexible interconnecting substrate as defined in claim 42, wherein the interconnecting patterns are formed so as to extend across the holes.

* * * * *